(12) United States Patent
Inoue et al.

(10) Patent No.: US 7,705,284 B2
(45) Date of Patent: Apr. 27, 2010

(54) HIGH-SPEED SINGLE-PHOTON DETECTOR IN TELECOMMUNICATION WAVELENGTH BAND

(75) Inventors: Shuichiro Inoue, Tokyo (JP); Naoto Namekata, Tokyo (JP); Shinji Sasamori, Tokyo (JP)

(73) Assignee: Nihon University, Tokyo (JP)

( * ) Notice: Subject to any disclaimer, the term of this patent is extended or adjusted under 35 U.S.C. 154(b) by 0 days.

(21) Appl. No.: 12/281,476

(22) PCT Filed: Mar. 2, 2007

(86) PCT No.: PCT/JP2007/054060

§ 371 (c)(1), (2), (4) Date: Sep. 2, 2008

(87) PCT Pub. No.: WO2007/102430

PCT Pub. Date: Sep. 13, 2007

(65) Prior Publication Data

US 2009/0039237 A1    Feb. 12, 2009

(30) Foreign Application Priority Data

Mar. 6, 2006    (JP)    ................. 2006-059505

(51) Int. Cl.
*H01J 40/14* (2006.01)
*H03G 3/20* (2006.01)
*H03K 3/42* (2006.01)
*H04B 10/04* (2006.01)

(52) U.S. Cl. .................... 250/214 R; 250/214 AG; 327/514; 398/189

(58) Field of Classification Search ............ 250/214 R, 250/214 A, 214 AG, 214 C, 214.1; 327/326, 327/514, 584, 535; 398/189, 196, 206, 210; 359/180, 184, 185, 189

See application file for complete search history.

(56) References Cited

U.S. PATENT DOCUMENTS 5,721,424 A * 2/1998 Price .................... 250/214 R

* cited by examiner

*Primary Examiner*—Georgia Y Epps
*Assistant Examiner*—Don Williams
(74) *Attorney, Agent, or Firm*—patenttm.us

(57) ABSTRACT

In order to operate a single photon detector in communication wavelength band at a high speed, a DC bias voltage 2 lower than the breakdown voltage is applied to an InGaAs/InP avalanche photodiode (APD) 1. A 500 MHz sine wave gating signal 3 is superimposed with the DC bias voltage 2 and applied to the APD 1 so as to exceed the breakdown voltage by about 4V in a fractional time of each period. The sine wave gating signal 3 passed through the APD 1 is substantially completely removed by a filter 4, thereby improving S/N and enabling to detect a single photon even if the avalanche multiplication time is shortened to reduce the after pulse and the detection period. As a result, it achieves to detect a single photon in the 1550 nm communication band at a high speed.

10 Claims, 18 Drawing Sheets

Variation of the detection time due to the changes of the gate (a) frequency and (b) amplitude $V_b$ : breakdown voltage
$V_e$ : excess voltage

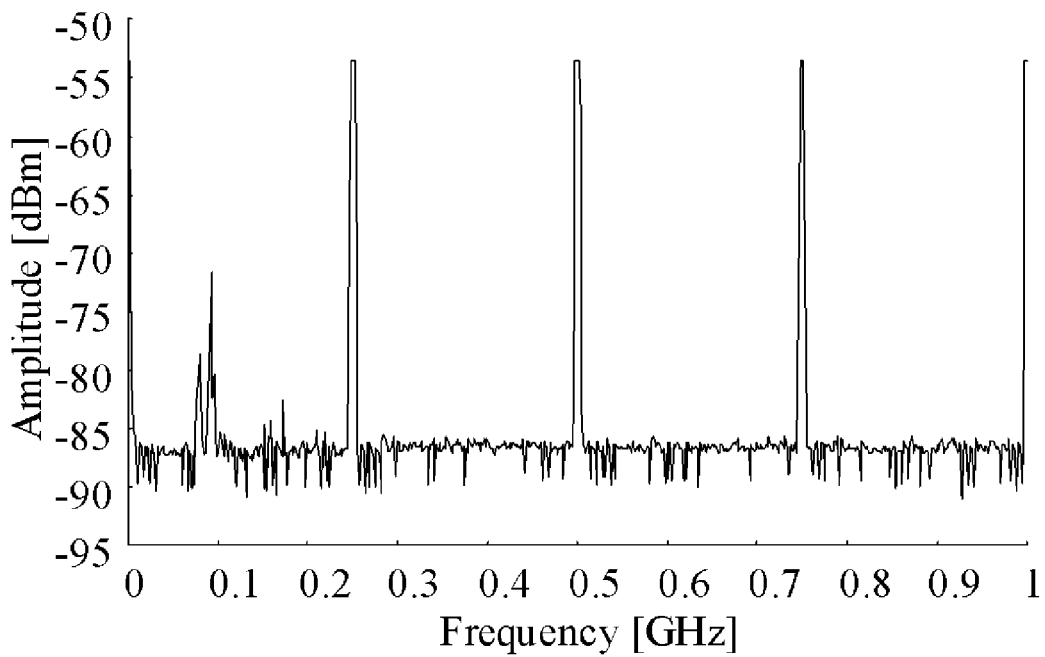
FIG. 3(a) excess bias voltage 1.9V
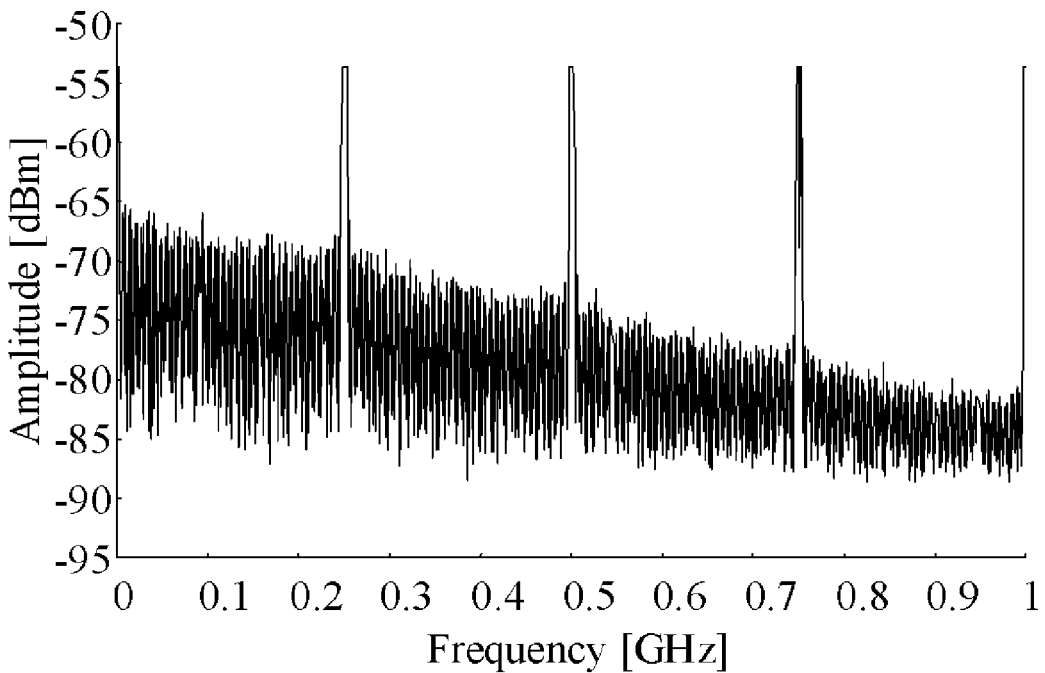
FIG. 3(b) excess bias voltage 4.2V
Spectrum of output signal from APD (a) Quantum efficiency vs. afterpulse probability at different temperature (b) Quantum efficiency vs. dark-count probability at different temperature Quantum efficiency vs. afterpulse probability at different gate frequency and amplitude Quantum efficiency vs. dark-count probability at different gate frequency and amplitude FIG. 10(a)
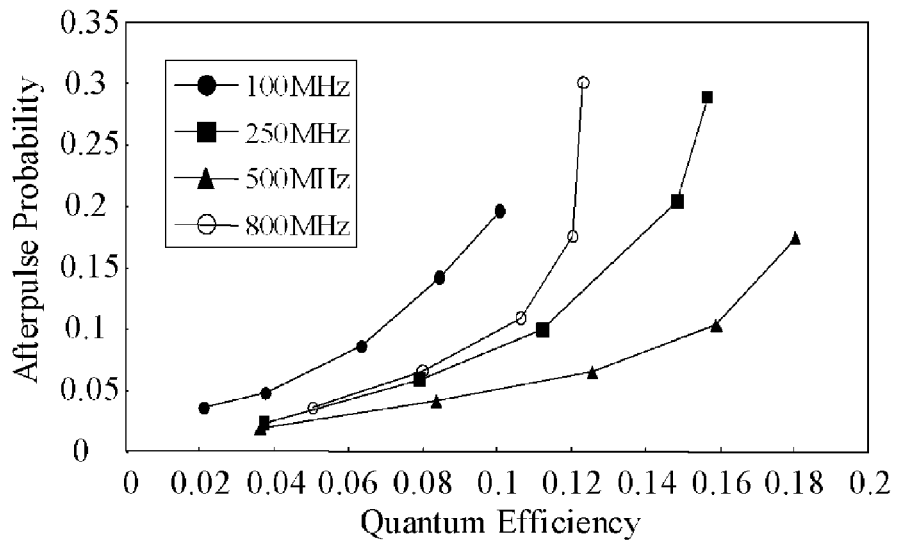
FIG. 10(b)
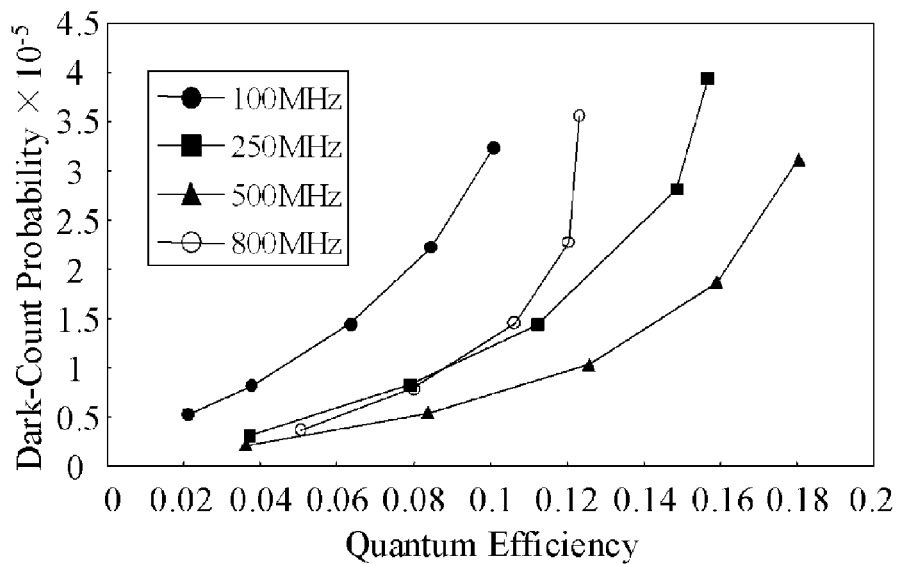
FIG. 10(c)
| Frequency | 100MHz | 250MHz | 500MHz | 800MHz |
|---|---|---|---|---|
| Detection time | 2.0ns | 1.2ns | 500ps | 400ps |
| Excess voltage | 1.8V | 3.0V | 3.6V | 3.6V |
Table 1 Detection time and excess voltage at gate's amplitude of 6V FIG. 11(b) Tabl 2 Performance of detector

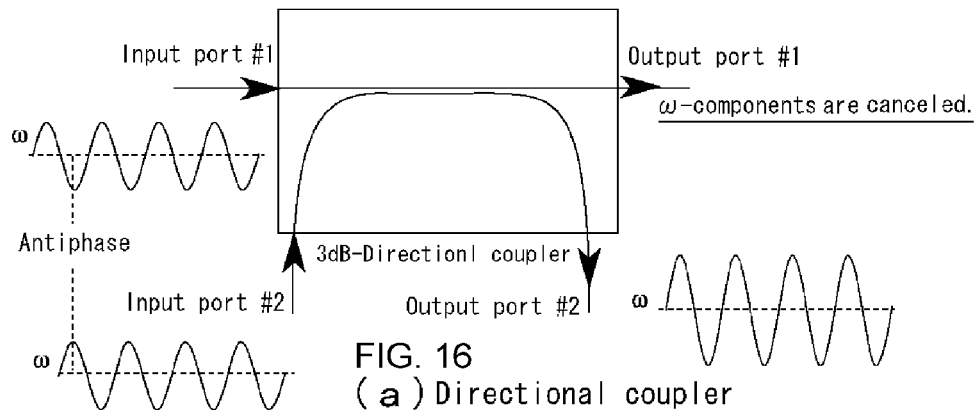
FIG. 16 (a) Directional coupler
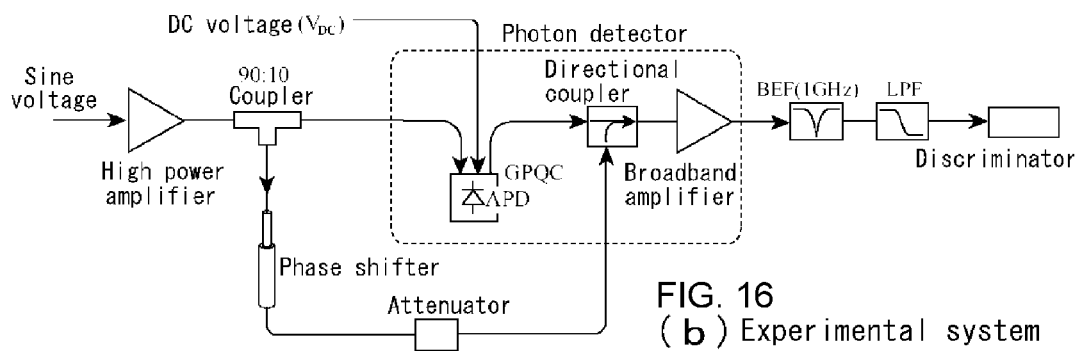
FIG. 16 (b) Experimental system
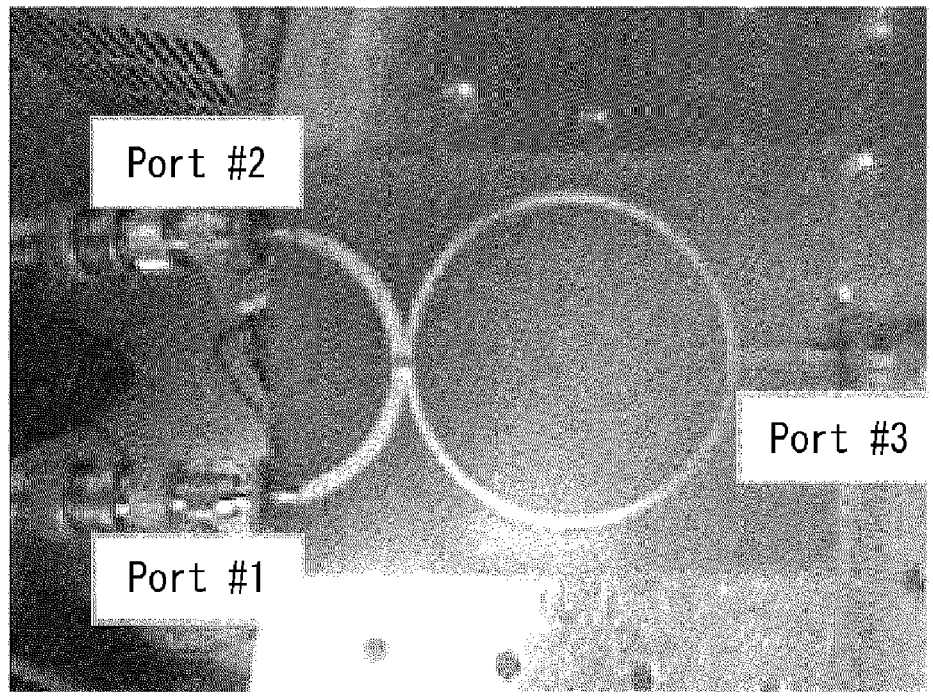
FIG. 16(c) 500MHzband-3dB-Wilkinson power coupler

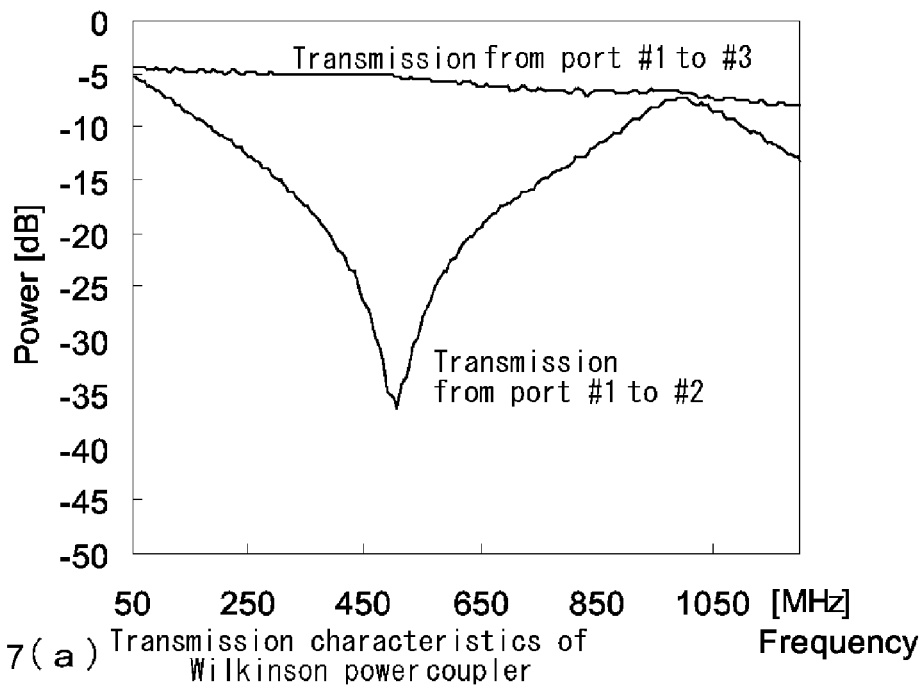
FIG. 17(a) Transmission characteristics of Wilkinson power coupler
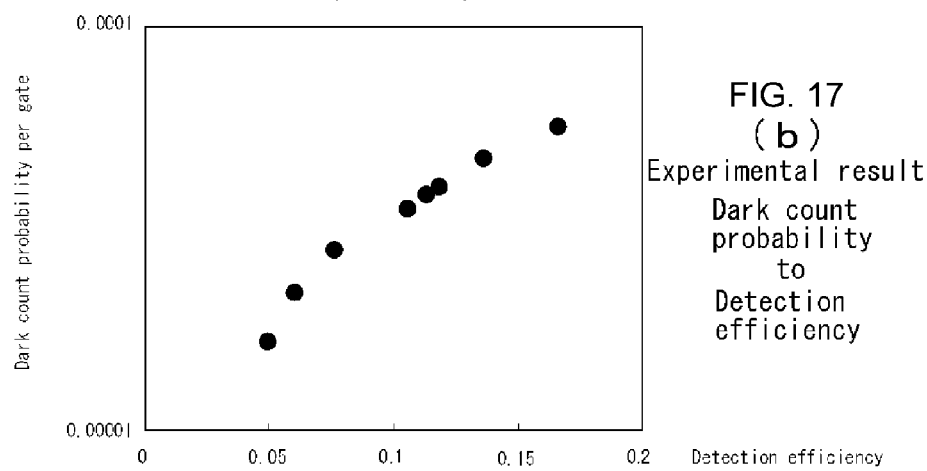
FIG. 17(b) Experimental result Dark count probability to Detection efficiency
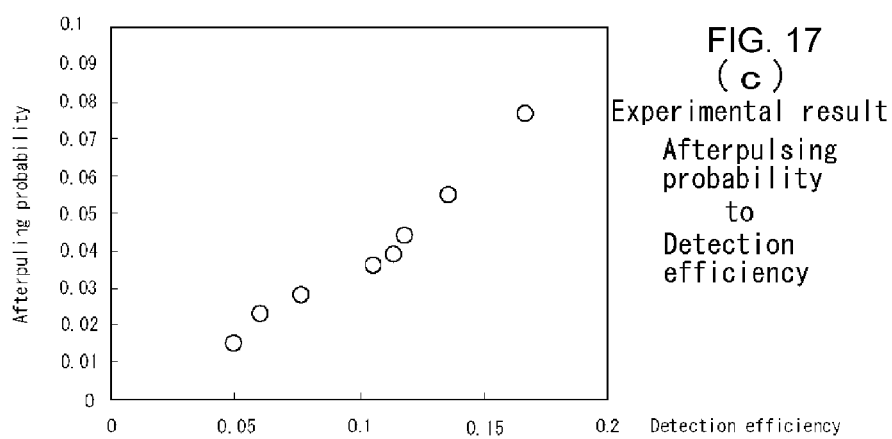
FIG. 17(c) Experimental result Afterpulsing probability to Detection efficiency

HIGH-SPEED SINGLE-PHOTON DETECTOR IN TELECOMMUNICATION WAVELENGTH BAND

FIELD OF INVENTION

The present invention relates to a high-speed single photon detector in optical communication wavelength band, especially to a single-photon detector based upon a sinusoidally gated avalanche photo-diode (APD).

BACKGROUND ART

In optical communication, a 1550 nm wavelength band is commonly used because of the minimum loss in optical fiber. In order to put a next-generation quantum communication into practical use, it is essential to develop a high speed single-photon detector in this particular communication band. An InGaAs/InP APD is currently used for detecting a single-photon in the 1550 nm wavelength band because it is most sensitive in such wavelength (see non-patent documents 1, 2 and 3 as listed hereunder). A method of detecting a single photon using an APD is basically the Geiger mode method. There are two methods as improvements of the Geiger mode method: one is a gating method and the other is an active-quenching method.

After pulsing is the most influential factor of limiting the repetition rate in photon detection using an APD. After pulsing is a phenomenon in which fractional parts of avalanche electrons are trapped in a defect level or the like and subsequently released at a certain time, thereby causing a new avalanche and outputting a pulse. Probability of causing such after pulsing is proportional to the intensity of the avalanche current that flows in the APD and decreases with time after termination of avalanche multiplication. After pulsing can be suppressed by decreasing the bias voltage and thus the magnitude of avalanche. Unfortunately, however, it becomes more difficult to detect photons when the magnitude of avalanche is small.

In the Geiger mode, a DC bias voltage higher than the breakdown voltage is applied to the APD and the resulting avalanche multiplication current caused by photons is converted into voltage for detection of the photons. When operating an InGaAs/InP APD in the Geiger mode, the probability of after pulsing is very large. As a result, it is impossible to detect subsequent photons until termination of the avalanche current and after pulsing noise, thereby enabling to detect only about one photon in every one microsecond. This is the reason why the APD is operated in the gated mode so that the APD is in the Geiger mode for only a short time.

In the gated mode, the APD is kept in the Geiger mode for about only 1 ns at the expected photon arrival time in order to reduce after pulsing noise. As shown in FIG. 18, a DC voltage lower than the APD breakdown voltage superimposed with a gate pulse signal is applied so that the bias voltage exceeds the breakdown voltage of the APD for a short time of about 1 nanosecond. The avalanche multiplication current caused by an incident photon is converted into voltage for detecting the photon. In case of using a rectangular-wave as the gate signal for photon detection, a detection threshold voltage must be set higher than the gate signal component (charge pulse) voltage in the output signal. As a result, in case of phone detection, the avalanche multiplication current must be in excess of the threshold voltage. A quantum efficiency, that represents the rate of causing avalanche by each photon, is proportional to the voltage applied to the APD. A dark count probability, that represents the probability of causing avalanche by thermal noise, is also proportional to the voltage applied to the APD. Therefore, the quantum efficiency and the dark count probability are always in the trade-off relationship. In a typical operational example, operation temperature is −30 degrees centigrade (243K), repetition frequency is about 100 kHz and the gate signal is several nanoseconds in width (see the non-patent documents 3 and 4).

In an active-quenching method, after pulsing noise is suppressed by forcedly stopping avalanche multiplication upon photon detection. As soon as recognizing occurrence of avalanche multiplication due to photon detection while applying to the APD a voltage in excess of its breakdown voltage, the APD voltage is decreased less than the breakdown voltage for terminating the avalanche multiplication. Thereafter, the voltage in excess of the breakdown voltage is applied to the APD again. Photons are detected continuously by repeating the foregoing operation. Some conventional examples relating to photon detection will be described hereunder.

A patent document 1 discloses a highly efficient single photon detector that is sensitive in the neighborhood of 1550 nm wavelength. An InGaAs-APD that is sensitive in the neighborhood of 1550 nm wavelength is operated in the Geiger mode. The APD is cooled during the operation in the gated mode by GPQC.

A patent document 2 discloses a single photon detection method for accurately detecting incidence of a single photon. Generated is a predetermined voltage lower than the APD breakdown voltage. A pulse voltage that is in excess of the breakdown voltage when combined with the predetermined voltage is generated in synchronism with a trigger signal that is generated simultaneously with outputting a photon from the single photon generation source. The photon is permitted to enter the APD when the predetermined voltage and the pulse voltage are applied to the APD, thereby detecting incidence of the photon when the output level of a pulse signal from the APD exceed the predetermined threshold level. The timing of applying the pulse voltage to the APD is adjusted to the optimum timing that is close to the incidence of the photon.

A patent document 3 discloses a single photon detector capable of changing the setting of a reference value corresponding to the quiescent time and easily removing a produced after pulse. A photon is detected by single photon detection means that comprises an APD as a light receiving device. There is control means for storing all detection times. It is determined to be a valid detection only if the difference between the current and the next previous photon detection times is longer than the preset reference value, thereby eliminating the after pulse.

A patent document 4 discloses a long distance quantum encryption system for extending the transmission distance by reducing photon loss in a receiver section and using a single photon detector of high efficiency, low dark count probability. A laser beam pulse of 1550 nm in wavelength is split into a horizontally polarized reference optical pulse and a vertically polarized signal optical pulse in an encryption key information receiver section. The signal optical pulse is delayed and transmitted. In an encryption key information transmitting section, the polarization surface of the reference optical pulse is rotated by 90 degrees. A random-phase shift is provided to the signal optical pulse to rotate the polarization surface by 90 degrees. These pulses are attenuated to be formed into single-photon pulses and are sent back. In the encryption key information receiving section, a random phase shift is provided to a feedback reference optical pulse for delaying it and superimposed with a feedback signal optical pulse. It is then split by a polarization optical splitter in response to its polarization state and is detected by an APD that is in a quiescent state only for a release time of trapped carriers, thereby obtaining the encryption key information.

A patent document 5 discloses a photon detector for detecting photon without removing noise due to charging pulses of an APD. A DC voltage lower than the breakdown voltage is applied to an APD as its bias voltage. A narrow voltage pulse is superimposed with the bias voltage at the forecasted photon arriving time. Since noise due to the charging pulses decreases when photon arrives to cause an avalanche current, this phenomenon is detected by a pulse height descriminator for judging photon arrival.

Reported in the non-patent document 1 is a 1550 nm single photon detector using a thermoelectrically cooled InGaAs-APD. It is a gated mode single photon detector sensitive to 1550 nm light using a thermoelectrically cooled InGaAs-APD. At the operation temperature of 238K, it exhibited a quantum efficiency of 24.3% with a dark count probability per gate of $9.4 \times 10^{-5}$.

The non-patent document 2 reports a photon counter using a Peltier cooled InGaAs-APD for quantum key distribution. The photon counting performance of three types of electronically cooled InGaAs/InP-APDs is studied at 1550 nm. The best result showed a dark count probability of $2.8 \times 10^{-5}$ per gate (2.4 ns) at the detection efficiency of 10% and temperature of −60 degrees centigrade. The after pulsing probability and the timing jitter are also studied for comparison to other reports and application to simulation in the quantum key distribution system. In a 54 km transmission, the achievable error rate appears to be 10%.

The non-patent document 3 reports a single photon detector for long-distance fiber optic quantum key distribution. The photon counting performance of a liquid nitrogen cooled InGaAs/InP-APD is studied at 1550 nm. The quantum efficiency of 13.7% was obtained at −55 degrees centigrade, while the dark count probability per gate (1 ns) was kept as small as $2.4 \times 10^{-5}$. The single photon detector could achieve a 104.4 km fiber-optic quantum key distribution under the ideal condition.

The non-patent document 4 reports an avalanche photo-diode and a quenching circuit for single photon detection. The APD is connected to an avalanche quenching circuit in the Geiger mode and operates above the breakdown voltage for detecting single photon. It is therefore known as a single photon avalanche diode SPAD. Circuit configurations suitable for this operation mode are studied in greater detail for assessment of its relative merits in photon counting and operation timing. Although a simple passive quenching circuit (PQC) is useful for SPAD device testing and selection, it has fairly limited applications. A properly designed active quenching circuit (AQC) is able to exploit the best performance of SPAD. A thick film silicon SPAD that operates at a high voltage (such as 250V-450V) exhibits the photon detection efficiency higher than 50% in the wavelength range of 540 nm-850 nm wavelength and as high as 3% at 1064 nm. A thin film silicon SPAD that operates at a low voltage (such as 10V-50V) exhibits the detection efficiency of 45% at 500 nm but decreases to 10% at 830 nm and to as low as 0.1% at 1064 nm. The time resolution achieved in photon timing is 20 ps (FWHM) with a thin film silicon SPAD, while it ranges from 350 to 150 ps (FWHM) with a thick film silicon SPAD. The achievable minimum counting dead time and maximum counting rate are 40 ns and 10 Mcps with a thick film silicon SPAD, while 10 ns and 40 Mcps with a thin film silicon SPAD. A germanium and III-V compound semiconductor SPAD may extend the photon counting range to at least 1600 nm or the near-infrared region.

The non-patent document 5 reports a high performance unitary single photon detector for communication wavelengths. A commercially available APD and a circuitry necessary for operating it as a single photon detector (SPD) are assembled on a single PC board (PCB) as a unit. At temperatures achievable with a Peltier cooler (e.g., 200K to 240K), the unitary single photon detector achieves high detection efficiency (DE) at 1308 nm and 1545 nm with low dark count probability (e.g. about $10^{-6}$/bias pulse at DE=20%, 220K), thereby making it useful for a quantum key distribution (QKD). High speed bias pulses are generated for canceling transient noise and amplifying the signal for sending it to a unitary discriminator. A digital blanking circuit suppresses after pulsing.

The non-patent document 6 reports a balanced gated mode photon detector for quantum bit discrimination at 1550 nm. A photon detector is developed by combining a pair of APDs for quantum bit discrimination at 1550 nm. Spikes accompanied with the signal in the gated mode are canceled by the balanced outputs from the two APDs. The spike cancellation enables one to reduce the threshold in the discriminators and thus the gate pulse voltage. The dark count probability and after pulsing probability were reduced to $7 \times 10^{-7}$ and $7 \times 10^{-4}$, respectively, without affecting the detection efficiency (11%) at 178K.

The non-patent document 7 reports a photon counter at 14 MHz using a room temperature InGaAs/InP-APD. Developed is a high speed gated mode single photon counter using an InGaAs/InP-APD at 1550 nm wavelength. It operates at room temperature up to 14 MHz with after pulsing probability at or below 0.2%. It exhibits the optimum equivalent noise power of $2.2 \times 10^{-15}$ WHz$^{-1/2}$ at 14% quantum efficiency with dark count probability of 0.2%. An equivalent noise power per gated frequency is used as a barometer for comparing high speed photon detectors. With this barometer, this system outperforms previously reported counters at 1550 nm wavelength. It demonstrates that for gate width of a nanosecond or below, amplitude difference distributions of dark versus light counts allow an optimum decision threshold to be set for a given bias voltage.

The non-patent document 8 reports a 10.5 km optical fiber quantum key distribution at 1550 nm wavelength with a key distribution rate of 45 kHz. A high-speed single-photon detector is crucial for efficiently performing quantum key distribution. A key distribution over an optical fiber is performed by using light of 1550 nm wavelength, and a single photon detector operating at 10 MHz. In order to supress after pulse generation, a single photon is detected by the discharge pulse counting. Furthermore, by setting a dead time in the single photon detection, after pulsing is neglected and the number of bit errors in the quantum key distribution is reduced. In the quantum key distribution, achieved is the key distribution rate of 45 kHz with the bit error rate of 2%. The length of the optical fiber is 10.5 km.

Patent document 1: JP2003-142724A

Patent document 2: JP2003-243694A

Patent document 3: JP2003-282933A

Patent document 4: JP2003-289298A

Patent document 5: JP2005-114712A

Non-patent document 1: A. Yoshizawa, and H. Tsuchida, "A single-photon detector using a thermoelectrically cooled InGaAs avalanche photodiode", Jpn. J. Appl. Phys., vol. 40, no. 1, pp. 200-201, 2001

Non-patent document 2: D. Stucki, G. Ribordy, A. Stefanov, H. Zbinden, J. G. Rarity, and T. Wall, "Photon counting for quantum key distribution with Peltier coold InGaAs/InP APD's", J. Mod. Opt., vol. 48, no. 13, pp. 1967-1982, 2001.

Non-patent document 3: N. Namekata, Y. Makino, and S. Inoue, "Single-photon detector for long-distance fiber optic quantum key distribution", Opt. Lett., vol. 27, no. 11, pp. 954-956, 2002.

Non-patent document 4: S. Cova, M. Ghioni, A. Lacaita, C. Samori, and F. Zappa, "Avalanche photodiodes and quenching circuits for single-photon detection", Appl. Opt., vol. 35 no. 12, pp. 1956-1976, 1996.

Non-patent document 5: D. S. Bethune, W. P. Risk, and G. W. Pabest, "A high-performance integrated single-photon detector for telecom wavelengths", J. Mod. Opt., vol. 51, no. 9-10, pp. 1359-1368, 2004.

Non-patent document 6: A. Tomita and K. Nakamura, "Balanced gated-mode photon detector for quantum-bit discrimination at 1550 nm" Opt. Lett., vol. 27, no. 20, pp. 1827-1829, 2002.

Non-patent document 7: P. L. Voss, K. G. Koprulu, S.-K. Choi, S. Dugan, and P. Kumar, "14 MHz rate photon counting with room temperature InGaAs/InP avalanche photodiodes", J. Mod. Opt., vol. 51, no. 9-10, pp. 1369-1379, 2004.

Non-patent document 8: A. Yoshizawa, R. Kaji, and H. Tsuchida, "10.5 km fiber-optic quantum key distribution at 1550 nm with a key rate of 45 kHz", Jpn. J. Appl. Phys., vol. 43, no. 6A, pp. L735-L737.

DISCLOSURE OF INVENTION

Problems to be Solved by the Invention

However, in the conventional single photon detectors, there are some problems. The single photon detection rate is limited to less than 10 MHz due to after pulsing. The degree of avalanche multiplication must be decreased in order to suppress after pulsing, thereby also decreasing the detected signal. However, the signal component cannot be decreased less than the charge pulse because there is a large noise due to the gating pulse. Since the gating pulse induces bipolar noise pulse at the output end, it is impossible to sufficiently remove such pulse by the conventional means. Although the repetition rate can be improved by the methods as reported in the non-patent documents 5 and 6, the charge pulse cannot be eliminated thoroughly because of losses in the cable and also because each APD exhibits different response to the gating signal. This is the reason why detection threshold can be reduced only to about ⅛ as compared to the level before removing the charge pulse.

It is therefore an object of this invention to solve the aforementioned problems and to operate the single photon detector at a higher speed.

Means for Solving the Problems

In order to solve the aforementioned problems, the single photon detector of the present invention is structured as follows. The single photon detector comprises an avalanche photodiode (APD) to detect a single photon in communication wavelength band, bias means to apply a reverse DC bias voltage lower than the breakdown voltage of the APD to the cathode of the APD, gating means to apply a sinusoidal gating signal to the APD in superimposing with the reverse DC bias voltage so as to surpass the breakdown voltage, and a filter to remove the sinusoidal gating signal component from the output signal of the APD.

ADVANTAGES OF THE INVENTION

According to the single photon detector as structured above, the sensitivity can be enhanced to about 100 times of the conventional detectors by minimizing the avalanche current and reducing after pulsing to about 6% at a high speed operation of 500 MHz. That is, the gate signal applied to an APD is changed from a rectangular pulse to a sine wave. A band rejection filter (BRF) is employed to remove the charge pulse for reducing the detection threshold to $\frac{1}{200}$. In this way, a single photon detection can be achieved with far less avalanche multiplication than the conventional InGaAs/InP APD, thereby achieving reduced after pulsing probability and higher repetition rate.

EXEMPLARY EMBODIMENT OF THE INVENTION

Now, an exemplary embodiment of this invention will be described in detail with reference to FIGS. 1 to 17.

Exemplary Embodiment

The exemplary embodiment of the present invention is a single photon detector wherein a reverse DC bias voltage less than the breakdown voltage is applied to an InGaAs/InP-APD, a sinusoidal gating signal at the frequency of 500 MHz is superimposed with the reverse DC bias voltage in such a manner to exceed the breakdown voltage by about 4V in a fraction of each cycle, and the sinusoidal gating signal passed through the APD is removed by a filter.

FIG. 1(a) shows a conceptual illustration of the single photon detector of one exemplary embodiment of the present invention. FIG. 1(b) shows the gating signal and the detected signal. In FIG. 1, the avalanche photodiode (APD) 1 is an InGaAs/InP-APD. The DC bias voltage 2 is a reverse bias voltage less than the breakdown voltage of the APD 1. The gating signal 3 is a sinusoidal signal that exceeds the breakdown voltage of APD 1 when added to the DC bias voltage. The gating signal 3 may contain the second or third harmonics. A filter 4 is a band-rejection filter to reject the gating signal components. A detected signal 5 is a remainder signal of the output signal from the APD 1.

FIG. 2 shows the relationship between the changes in the frequency/amplitude and the detection time. FIG. 2(a) shows the gating signal of varying frequencies while maintaining the amplitude constant. FIG. 2(b) shows the gating signal of varying amplitudes while maintaining the frequency constant. $V_b$ represents the breakdown voltage and Ve represents an excessive voltage (the voltage in excess of the breakdown voltage). FIG. 3 shows spectra of the signal from the APD. FIG. 3(a) shows an example wherein the excessive voltage is 1.9V. FIG. 3(b) shows an example wherein the excessive voltage is 4.2V. FIG. 4 shows the output signal that is amplified by 20 dB after passing through the BRF.

FIG. 5 shows the entire system for characteristic measurements. FIG. 6(a) shows a graph of the quantum efficiency to after pulsing probability at various temperatures. FIG. 6(b) shows a graph of the quantum efficiency to dark count at various temperatures. FIG. 7 shows a graph of time-dependency of after pulsing probability at various temperatures. FIG. 8 shows a graph of the quantum efficiency to after pulsing probability according to the variation of the gating frequency and the gating signal amplitude. FIG. 9 shows a graph of the quantum efficiency vs. dark count at different gating signal frequencies and amplitudes. FIG. 10(a) shows a graph of quantum efficiency to after pulsing probability according to the variation of the gating frequency and the gating signal amplitude. FIG. 10(b) is a graph to show the relationship of quantum efficiency to dark count depending on frequency difference. It is to be noted that the gating signal amplitude is 4V at 800 MHz but 6V at other frequencies. FIG. 10(c) is a table of the detectable time and the excessive voltage when the gate amplitude is 6V.

FIG. 11(a) is a graph to show time dependency of after pulsing probability by various detection methods. FIG. 11(b) is a table of the detector performance. FIG. 12 is a graph of gating signal derived from a mode-lock signal attenuated by 16 dB. FIG. 12(a) is a graph of the output signal and FIG. 12(b) shows its spectrum. FIG. 13 is a graph of quantum efficiency to after pulsing and dark count when detected at 80 MHz. FIG. 14 is a graph showing the correlation at photon detection. FIG. 15 is the waveform of the gating signal that comprises the fundamental wave and harmonics.

FIG. 16 shows a directional coupler, a conceptual diagram of an experimental system and a photograph of Wilkinson power coupler (WPC). FIG. 17 shows a graph of isolation characteristics of WPC, a graph of measurement result of dark count probability to detection efficiency and a graph of measurement result of after pulsing probability to detection efficiency.

Now, descriptions will be made on the function and operation of the single photon detector of the exemplary embodiment of the present invention having the aforementioned construction. Firstly, referring to FIG. 1, the general function of the single photon detector will be described. The basic construction of the single photon detector is the same as the conventional gating detector system. However, it differs in the gating signal and the filter. The gating signal 3 is sine wave. The band rejection filter 4 removes the gating signal components in the output signal from the APD 1. Since the gating signal 3 is sine wave, the gating signal components in the output signal are also sine wave. The gating signal components appear as line spectrum, thereby enabling to remove without disturbing the signal components. The signal components can be detected clearly even if the avalanche multiplication is small because there is no gating signal noise in the output signal. The possibility of reducing the avalanche multiplication helps to decrease the current through the APD 1 and in turn reduce after pulse generation probability and increase the repetition frequency. When operated at the repetition frequency of 500 MHz, it achieves 12% in quantum efficiency, $1\times10^{-5}$ in dark count and 6.5% in after pulsing probability. On the other hand, when operated at the repetition frequency of 80 MHs and detected photons in the series of pulses generated by the mode-lock laser, it achieves 9% in quantum efficiency, $5.9\times10^{-6}$ in dark count and 0.5% in after pulsing probability.

By using a sine wave as the gating signal 3, the timing of its peak amplitude is synchronized with the photon incident timing. Under this condition, the charge pulse in the output signal from the APD 1 is only sinusoidal components of the gating signal, thereby enabling to easily reject such sinusoidal components by the band rejection filter (BRF) 4. Since the optical detection signal is impulse, it includes various frequency components spread widely in spectrum. Thus, the impulse signal passes through the BRF 4 with slight loss. As a result, it is possible to improve S/N ratio and set the detection threshold to a low value, thereby enabling to detect a single photon with a low avalanche multiplication. A conventional gated passive quenching circuit (GPQC) similar to the detection method using a rectangular wave gate signal can be used as it is in the driving circuit for the APD 1. A 1 μF coupling capacitor, a 51Ω input resistor and a 47 kΩ ballast resistor (current limiting resistor) are connected to the cathode of the APD 1. On the other hand, a 51Ω output resistor is connected to the anode of the APD 1.

Now, a reference is made to FIG. 2 for describing the variation in frequency and amplitude of the sine wave to be used for the gating signal and the photon detection time. The detection time is defined as the time in which the voltage in excess of the breakdown voltage (breakdown voltage+excessive voltage) is applied to the APD 1. The higher is the gating signal frequency, the shorter becomes the detection time. Also, the detection time becomes shorter when the bias voltage is decreased and the gating signal amplitude is increased while maintaining the excessive voltage constant. Since avalanche multiplication occurs only in this detection time, if the detection time span is narrowed, the avalanche multiplication is quenched and the output current from the APD becomes smaller. However, it is impossible to overly shorten the detection time because there is the minimum response time of about several 100 ps from photon absorption to avalanche multiplication. That is, it requires a certain time to the avalanche multiplication to occur after photon absorption. If the detection time is too short, the excessive voltage will be applied to the APD while excited electrons are not in existence and it does not remain effective until the response time is over, thereby decreasing the apparent quantum efficiency.

Then, a reference is made to FIGS. 3 and 4 for describing the principle of operation. A 4V and 250 MHz sine wave is used as the gating signal of the GPQC. An RF spectrum analyzer is used for measuring the output signal. An APD (available from EPITAXX under the trade name EPM239-BA) with the breakdown voltage of 52.1V is operated at 20 degrees centigrade. FIG. 3(a) shows spectra of the output signal when applying the gating signal with the excessive voltage of 1.9V. The spectra of the output signal are concentrated at 250 MHz and its harmonics. FIG. 3(b) shows spectra when applying the excessive voltage of 4.2V. The spectra appear in wider frequency band. This change in spectra is caused by the avalanche multiplication by thermal excitation. The signal by the thermal excitation is the same as the signal by the photon detection. Consequently, it is understood that the change of the signal by the avalanche multiplication can be detected as the output signal even if the charge pulse is rejected from the output of the APD. FIG. 4 shows the actual waveform amplified by 20 dB after rejection of the charge pulse. The peak at 50 ns is the avalanche multiplication caused by such thermal excitation. The detection threshold can be settled at about 2 mV. The voltage of the charge pulse from the APD is only about 10 mV on the 51Ω load resistor. In order to reject the charge pulse, used is a BRF having the center frequency of 250 MHz, attenuation frequency bandwidth of 100 MHz and power attenuation of 33 dB. Also used for eliminating the second harmonic is another BRF having the center frequency of 500 MHz, attenuation frequency bandwidth of 150 MHz and power attenuation of 19 dB.

Now, a reference is made to FIG. 5 for describing methods of measuring the quantum efficiency, the dark count and the after pulsing probability. A sine wave from a signal generator is split by a splitter into a gating signal and a trigger signal for the laser. An amplifier amplifies the amplitude of the gating signal up to 6V and an attenuator attenuates the amplitude to a desired voltage. The output signal from the detector is passed through a BRF in order to attenuate the charge pulse. Then, a wideband amplifier amplifies the signal by 20 dB to be counted by a counter (available from STANFORD RESEARCH SYSTEMS under the trade name SR400).

The after pulsing is measured using an instrument as shown in FIG. 5(1). The detected signal from the detector is counted by a counter and simultaneously converted into a NIM level digital signal. The digital signal is then split into two signals for use as start and stop signals for a multi-channel scaler (MCS) that measures the time correlation of the digital signal. The after pulsing is evaluated based on autocorrelation by handling the time-correlation gained by the dark count as time-sequential data. The reason of using the dark count is to ignore the correlation depending upon the output of the laser. Moreover, the signal of the dark count is hard to distinguish from the avalanche multiplication current that is outputted at the time of photon detection and they are equivalent signals. Therefore, the after pulsing probability due to the dark count is considered to be equal to the after pulsing probability at photon detection.

The autocorrelation function is given by the following formula (1):

$$G^{(2)}(kt')=\{n(t)n(t+kt')\}/\{n^-(t)n^-(t+kt')\} \quad (1)$$

Here, t' is the measurement interval (bin), n(t) is counts within t' before and after the time t, n(t+kt') is counts after the time kt', n⁻(t) and n⁻(t+kt') are mean values of counts within time t' at the respective times.

The after pulsing can be evaluated by referring to the correlation after outputting the detection signal. Assuming that the count (start signal) never fails to take place at the time t, the formula (1) can be rewritten to the following formula (2):

$$G^{(2)}(kt')=n(t+kt')/\{n^-(t+kt')\} \quad (2)$$

Here, the autocorrelation becomes 1 if k is infinity because there are only such counts as in no correlation with the start signal (dark count at k=0). It becomes over 1 due to influence of the after pulsing that is in correlation with the start signal. Therefore, if the after pulsing probability after the time of kt' is p(kt'), the formula (2) can be rewritten to the following formula (3):

$$G^{(2)}(kt')=1+p(kt')/n^-(kt') \quad (3)$$

And the after pulsing probability is given by the following formula (4):

$$p(kt')=[G^{(2)}(kt')-1]n^-(kt') \quad (4)$$

The after pulsing probability of the entire detector is given by the following formula (5):

$$x=\Sigma_{k=1}^{M}p(kt') \quad (5)$$

It is to be noted that M represents the number of measurement points. The MCS measurement interval t' is 2.5 ns. The measurement points are $2^{16}$. The after pulsing probability can be calculated using the above formulae (4) and (5). Moreover, since the MCS has a dead time of about 50 ns, a correction is made in this time period by approximation of an exponential function.

The quantum efficiency and dark count are measured by generating single photons by a device as shown in FIG. 5(2). A laser system (available from HAMAMATSU under trade name of PLP-01) generates a laser beam of 1550 nm in wavelength and 50 ps in pulse width. Since the maximum repetition frequency of the laser is 10 MHz, a signal that is split for triggering the laser is divided to 10 MHz or lower. Then, a delay circuit is used for triggering the laser in alignment with the detection time of the detector. An optical attenuator attenuates the output light to the mean value of 0.1 photon per pulse before being detected by the APD and counted by a counter. The quantum efficiency is calculated with the following formula (6):

$$\eta=\{(Nc-Nd)/uv\}(1-x) \quad (6)$$

It is to be noted herein that u is the mean photon number, v is the laser repetition frequency, Nc is the count number of the incident photons in one second, Nd is the dark count in one second and x is the after pulsing probability.

Now, referring to FIGS. 6 and 7, description will be made on a method of finding the temperature for minimizing the after pulsing probability relative to the quantum efficiency. Temperature is varied from −25 degrees centigrade to −45 degrees centigrade in step of 5 degrees centigrade when the gating frequency is 250 MHz and the laser repetition frequency is 3.90 MHz. FIG. 6 shows the relationship among the quantum efficiency, the after pulsing probability and the dark count while varying the temperature. The after pulsing probability and the dark count relative to the quantum efficiency become minimum at the temperature of −35 degrees centigrade. FIG. 7 shows the after pulsing probability at every measurement time when the quantum efficiency is 7% and the temperature is set to −25 degrees centigrade, −35 degrees centigrade and −45 degrees centigrade. Significant changes are seen in the after pulsing probability within 1 microsecond when the temperature is varied.

Then, temperature dependency of the after pulsing probability will be described. The lifetime of the carrier trapped in the defect of the APD becomes long when the APD is operated at low temperature and the after pulsing probability does exist for about 6 microseconds at −45 degrees centigrade. Therefore, the after pulsing probability in the entire measurement time will become large. When the temperature is high, the breakdown voltage becomes high and thus a high voltage must be applied to the APD. Carriers generated in the APD gain larger acceleration by the high electric field rather than at low temperature, thereby increasing the output current in one detection time. This means that the trapped carriers increase at low temperature and the after pulsing probability per measurement time also increases. Consequently, −35 degrees centigrade is the optimal temperature.

Now, reference is made to FIGS. 8, 9 and 10 for describing how to find the optimal value in the operational conditions. The temperature is fixed to −35 degrees centigrade (46.1V in the breakdown voltage) while the gating frequency is set to 100 MHz, 250 MHz, 500 MHz or 800 MHz. The frequency is divided into 1/128 in case of 800 MHz while dividing to 1/64 in other frequencies for generating photons. Therefore, the laser repetition frequency is 1.56 MHz, 3.90 MHz, 7.81 MHz or 6.25 MHz. The amplitude of the gating signal is varied from 3V to 6V in step of 1V for changing the detection time at every measurement point. FIGS. 8 and 9 show the results when varying the repetition frequency and the amplitude of the gating signal. The after pulsing probability relative to the quantum efficiency can be suppressed by increasing the amplitude of the gating signal and shortening the detection time up to 500 MHz in the operation frequency. However, the best result is achieved when the amplitude is 4V in case of 800 MHz. The detection time is 500 ps and the excessive voltage is 3.6V when the quantum efficiency is 10%. The table 1 in FIG. 10(c) shows the detection time and excessive voltage at each gating frequency when the amplitude is 6V to provide the minimal detection time and the quantum efficiency is 10%.

A higher excessive voltage is needed as the detection time becomes shorter. The output current from the APD decreases as the detection time becomes short. A higher excessive voltage is needed in order to obtain the minimum current that is detectable by the counter. The quantum efficiency will fall when the photon detection time reaches 400 ps. Since 400 ps is shorter than the response time from photon absorption to the avalanche multiplication, it is impossible to achieve sufficient avalanche multiplication. The optimal point is at the detection time of about 500 ps. FIG. 10 collectively shows the results at the optimum detection time for the after pulsing probability and dark count relative to the quantum efficiency at different gating frequencies. In case of 500 MHz, the quantum efficiency is 12%, the dark count is $1\times10^{-5}$ and the after pulsing probability is 6.5%.

Then, a reference is made to FIG. 11 for describing the present invention in comparison to the conventional detection method. FIG. 11(a) shows the after pulsing probability when using a sinusoidal gating signal in comparison to the case of using a rectangular-wave gating signal. In case of a sinusoidal gating signal at 500 MHz repetition frequency, it exhibited 12% in the quantum efficiency and $1\times10^{-5}$ in the dark count. On the other hand, in case of a rectangular-wave gating signal at the repetition frequency of 5 MHz, it exhibits 9% in the quantum efficiency and $2\times10^{-5}$ in the dark count. The rectangular gating signal has the peak voltage of 6V, each of the rising and falling transient time is 1 ns, the detection time is 1.4 ns at the quantum efficiency of 9% and the excessive voltage is 4.7V. On the other hand, in case of the 500 MHz sinusoidal gating signal, the detection time is 500 ps and the excessive voltage is 3.6V.

Now, comparing the after pulsing probabilities at one measuring point after 200 ns, the after pulsing probability in the case of the sinusoidal gating signal is suppressed to 1/20 of that in case of the rectangular gating signal. Also, the detection time in case of the rectangular gating signal is as long as 1.4 ns, but the excessive voltage in case of the sinusoidal gating signal is smaller than that in case of the rectangular gating signal. As a result, photon detection can be made with less avalanche multiplication in the detection method that uses the sinusoidal gating signal than the conventional detection method. The after pulsing probability is suppressed at each measuring point. However, since the gating frequency is 5 MHz in the rectangular case, the number of measuring points in this case is 1/100 as compared to the 500 MHz sinusoidal gating case. As a result, the after pulsing probability over the entire measurement time is as small as 1%.

FIG. 11(b) is a table to show the comparison to an exemplified conventional gating operation at or higher than 10 MHz. Although the quantum efficiency is low, in case of detecting 0.1 photon pulse in average, the repetition frequency is 50 times. Since the photon counting per 1 second can be calculated by multiplying the repetition frequency and the efficiency, it is possible to obtain the photon counts equal to about 30 times.

Now, reference is made to FIGS. 12, 13 and 14 for describing the synchronous detection at 80 MHz. When the gating signal frequency goes down below 100 MHz, it is no longer possible to expect any reduction in the after pulsing probability because of extended detection time. This is the reason why the gating signal frequency of the detector is set to about 500 MHz using the harmonics of the desired gating frequency. As a result, the photon detection can be attained even if the laser repetition frequency is fixed to any frequency lower than 100 MHz. A weak coherent light pulse from the mode-lock laser (1550 nm in wavelength) is used as the light source for detecting photons at the repetition frequency of 80 MHz. The mode-lock signal (80 MHz) from the laser is amplified and its peak amplitude is truncated for obtaining the intended 80 MHz rectangular wave. The rectangular wave contains various harmonics the sixth harmonic (480 MHz) of which is extracted using a band pass filter BPF) for generating the gating signal. By employing the foregoing procedure, the gating signal in synchronism with the 80 MHz reference (or basic) signal can be obtained easily using an amplifier and passive elements that constitute the band pass filter.

FIG. 12 shows the waveform of the gating signal and its spectra. Apparently, the gating signal contains some harmonic components that are unfiltered by the BPF. Then, BRFs (480 MHz and 960 MHz) are used to remove the gating signal that is outputted from the APD. It is to be noted that the pulse width of the signal containing harmonics is thinner than that of a single frequency. This fact means that the duty ratio of the gating time and the non-gating time becomes small if the gating signal has some harmonics, thereby helping to suppress the after pulsing. Additionally, it is to be noted that if only the sixth harmonic can be extracted, it can be used as the gating signal and BRFs for rejecting other harmonics can be eliminated.

FIG. 13 shows the after pulsing probability and the dark count relative to the quantum efficiency. The amplitude of the gating signal is 6V, the quantum efficiency is 9%, the dark count is $3.5\times10^{-5}$ and the after pulsing probability is 3.7%. The excessive voltage is 3.4V and the detection time is about 500 ps. FIG. 14 shows the autocorrelation at the photon incidence. In this case, the measurement interval t' is 2.4 ps. There is no significant correlation in the gating times other than the photon arriving time and the correlation is seen at the interval of 12.5 ns that is equal to the laser repetition frequency. Fluctuation of the photon detection signal is about 1 ns and falls within the interval (2 ns) of the gating signal frequency of 480 MHz. This means that the photon absorbed in the APD is multiplied within one detection time and is outputted. As a result, the photon outputted from the laser and the gate signal are precisely synchronized with each other.

Since the sixth harmonic is used as the gating signal, there are the dark count and the after pulsing probability in the gating times that is asynchronous with the light. Accordingly, only the signals corresponding to the photon arriving time are separated from the APD output signal and the other signals are discarded, thereby decreasing the dark count to 1/6 and further reducing the after pulsing probability. The dark count is $5.9\times10^{-6}$ and the after pulsing probability is about 0.5% when the quantum efficiency is 9%.

By using a sine wave as the gating signal for the existing GPQC and removing the charge pulses from the output signal, a detection can be made at a small multiplication factor and the after pulsing probability can be suppressed. This detection method is realized by interposing a filter at the output of the GPQC for attenuating the gating signal frequency and an amplifier for amplifying the output. Therefore, a high speed operation is achieved without modifying the APD driving circuit in the conventional detection method that uses a rectangular gating signal. With 500 MHz maximum repetition frequency and 12% quantum efficiency, the dark count is $1\times10^{-5}$ and the after pulsing probability is 6.5%. Even with detection at 100 MHz or lower, it is possible to achieve detection with reduced after pulsing probability by using as the gating signal the harmonics of about 500 MHz that is synchronized with the fundamental signal.

Then, a reference is made to FIG. 15 for describing the method of using the gating signal consisting of a fundamental wave and its harmonics. As shown in FIG. 15(a), the gating signal is generated by summing the inverted third harmonic to the fundamental wave. By adding the inverted third harmonic, the gating signal decreases its width and increases its peak value. The gating time can be shorter in spite of increasing the gating signal frequency. The avalanche multiplication time can be decreased because of the shorter gating time. This means that the after pulsing probability is smaller. BRFs can be used for easily removing noise of the charge pulse in the output signal because it is the fundamental wave and third harmonic components.

Alternatively, the gating signal is generated by summing the non-inverted second harmonic to the fundamental wave as shown in FIG. 15(b). In this case, the gating signal decreases the width and increases its peak value. The gating time can be shorter even if the gating signal frequency is high. As a result of shorter gating time, the avalanche multiplication time can be shorter and the after pulsing probability can be smaller. Noise due to the charge pulse in the output signal can be removed easily using BRFs because it is the fundamental wave and second harmonic components.

The optimal gating time and the optimal excessive voltage can be set by properly choosing the reverse DC bias voltage, the gating signal frequency as well as the phase and amplitude of the harmonic in response to the arriving photon frequency. For example, the excessive voltage can be set low while shortening the gating time. In this way, the after pulsing probability can be reduced to its limitation.

Next, referring to FIGS. 16 and 17, the method to use a directional coupler as a filter to eliminate the component of the sine-wave gating signal in the output signal of the avalanche photo diode is explained. In the gate operation using sine-wave voltage, weak avalanche signal can be discriminated by eliminating the background noise (the major component is sine-wave voltage signal of gating frequency ω) out of the avalanche photo diode (APD) using a band-elimination filter (BEF). By this way, the number of multiplying electrons passing through the APD can be reduced. The number of captured electrons to cause the after pulsing noises to block improvement of gating repetition frequency is reduced. That is, the rejection ratio of background noise and the transmittance of the BEF are the most important elements for improvement of the gating repetition frequency.

The BEF attenuates strongly the component of frequency ω of the background noise. But as it has finite band width of elimination, it also eliminates strongly the component of the avalanche signal near the frequency ω. To see the example of the frequency of 250 MHz, as the elimination band has the width about 100 MHz, the frequency component near 200 to 300 MHz of the avalanche signal has a large loss. In order to eliminate the background noise much efficiently, the BEF with much narrower bandwidth must be employed.

The BEF with narrower bandwidth is not practical because of its difficulty of fabrication. Then, the method to employ a directional coupler is proposed. FIG. 16(a) shows a conceptual diagram of a directional coupler. As shown in this figure, the directional coupler has two input ports and two output ports. Composition of two input signals is generated to output. Therefore, the signal out of the APD is applied to the input port #1, the sine-wave voltage synchronized in phase to the sine-wave voltage used as gating signal is applied in opposite phase to the input port #2. In this way, the background noise of frequency ω can be canceled at the output port #1. On the other hand, in the frequency band other than the frequency ω, signals only suffer the losses determined by the branching ratio of the directional coupler. For example, when the branching ratio is 3 dB, the loss is 3 dB. When the branching ratio is 10 dB, the loss is 1.5 dB. In this principle, the directional coupler operates as a narrow-band BEF.

FIG. 16(b) shows a concept of the experimental system. The sine-wave voltage of 500 MHz amplified to 14Vpp by the voltage amplifier is branched by the coupler of 90:10. 90% of this signal is used as the gating signal. The signal out of the APD is applied to the input port #1 of the directional coupler. 10% of the sine-wave signal branched by the coupler is applied to the input port #2. The voltage amplitude and the phase of this sine-wave voltage are regulated formerly with an attenuator and a phase shifter respectively in order to make the interference degree maximum at the directional coupler. In the signal out of the directional coupler, the background noise at the frequency of 500 MHz is only canceled. In fact, the background noise has the second harmonics and more, but they are not canceled with the directional coupler. Therefore, the background noises of second harmonics and more are eliminated with the BEF of center frequency of 1 GHz and the low pass filter (LPF) of bandwidth of 600 MHz. Because of simplicity, 3 dB-Wilkinson power coupler (WPC) is employed as a directional coupler. FIG. 16(c) shows a WPC used here. This WPC has three input-output ports. This time, port #1 and port #2 are used as input ports and port #3 is used as an output port. The isolation characteristics of WPC between port #1 and port #2 depends on frequency. This time, WPC is designed so that the isolation is maximal at the frequency of 500 MHz of sine-wave gating operation. FIG. 17(a) shows the isolation characteristics of WPC prepared here. The isolation from port #1 to port #2 is 30 dB at the frequency of 500 MHz. The avalanche signal distilled with above-mentioned system is amplified by 20 dB and finally applied to the discriminator. Here, the threshold of discrimination can be set at 3 mV lower than that at the case using BEF. And also, photon can be detected under the condition that the DC voltage applied to APD is lowered by 0.5V in average. This fact shows that the avalanche signal can be distilled more efficiently.

FIGS. 17(b) and (c) show the measurement results of detection efficiency, dark count probability and total after pulsing probability. At the detection efficiency of 14%, dark count probability is $4.7 \times 10^{-5}$ and total after pulsing probability is 5.5%. Comparing with the former experimental result using BEF, the total after pulsing probability is improved a little. One of the reasons of no achievement of big improvement is the bandwidth of the discriminator. The current discriminator is SR400 of Stanford Research Systems. Its bandwidth is 300 MHz. Thus, it is considered that the difference of attenuation characteristics around the gating frequency of 500 MHz cannot be observed clearly. And also, in this experimentation, 3 dB-WPC is employed because of simplicity. Thus, there is signal loss of about 3.5 dB. The problem to reduce this loss is solved by employing the directional coupler having asymmetric branching ratio more than 10 dB. In this case, there is a loss of 1.5 dB. By improving two above-mentioned points, it is expected that the performance of the detector would improve enormously.

As described herein above, the single photon detector according to the embodiment of the present invention enables to detect photons at a high speed such as, for example, 500 MHz by applying to the InGaAs/InP-APD a DC bias voltage lower than its breakdown voltage, superimposing a 500 MHz sine wave gating signal with the DC bias voltage so as to exceed the breakdown voltage by about 4V for a fractional time in each period, and removing the sine wave gate signal passing through the APD by a filter.

INDUSTRIAL APPLICABILITY

The high speed single-photon detector in optical communication band of the present invention finds preferable applications as a single photon detector for quantum information communication such as a quantum encryption, an Optical Time-Domain Reflectometer (OTDR) and the like.

BRIEF DESCRIPTION OF THE DRAWINGS

FIG. 3 shows spectra of the signal outputted from the APD.

FIG. 10 is a graph of the quantum efficiency vs. after pulsing probability at different frequencies and a graph of the quantum efficiency vs. dark count at different frequencies.

FIG. 16 is a set of a conceptual diagram of a directional coupler, a conceptual diagram of an experimental system and a photograph of Wilkinson power coupler (WPC).

FIG. 17 is a set of graphs of isolation characteristics of WPC, measurement result of dark count probability to detection efficiency and measurement result of after pulsing probability to detection efficiency.

REFERENCE SYMBOLS

Figure 1A:
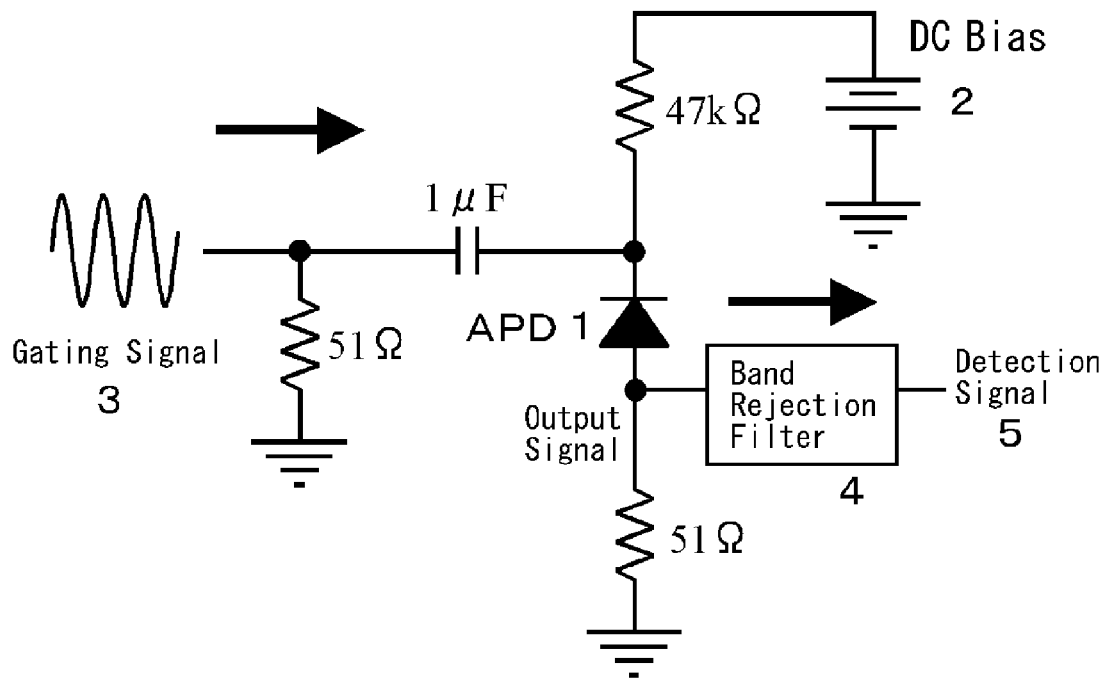
FIG. 1 is a conceptual illustration of the single photon detector according to one embodiment of the present invention together with the gate signal and the detection signal.
Figure 1B:
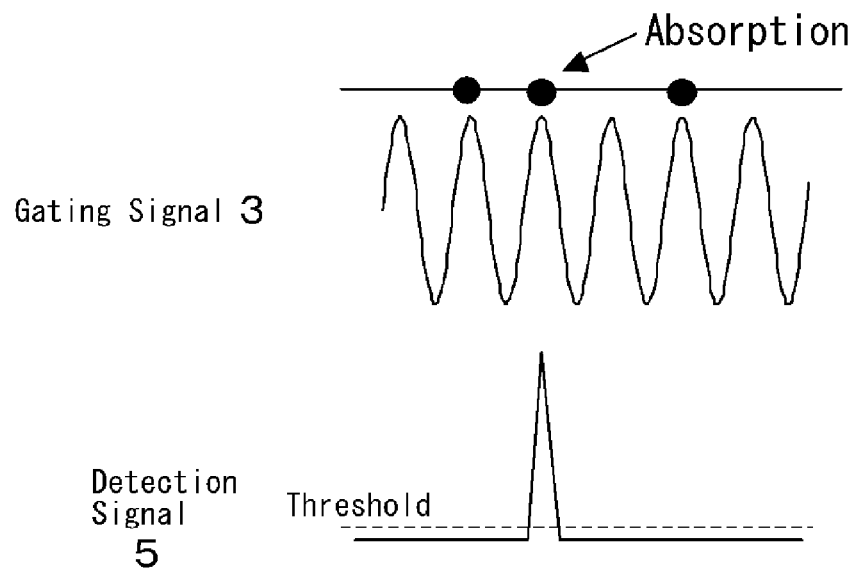
Figure 2:
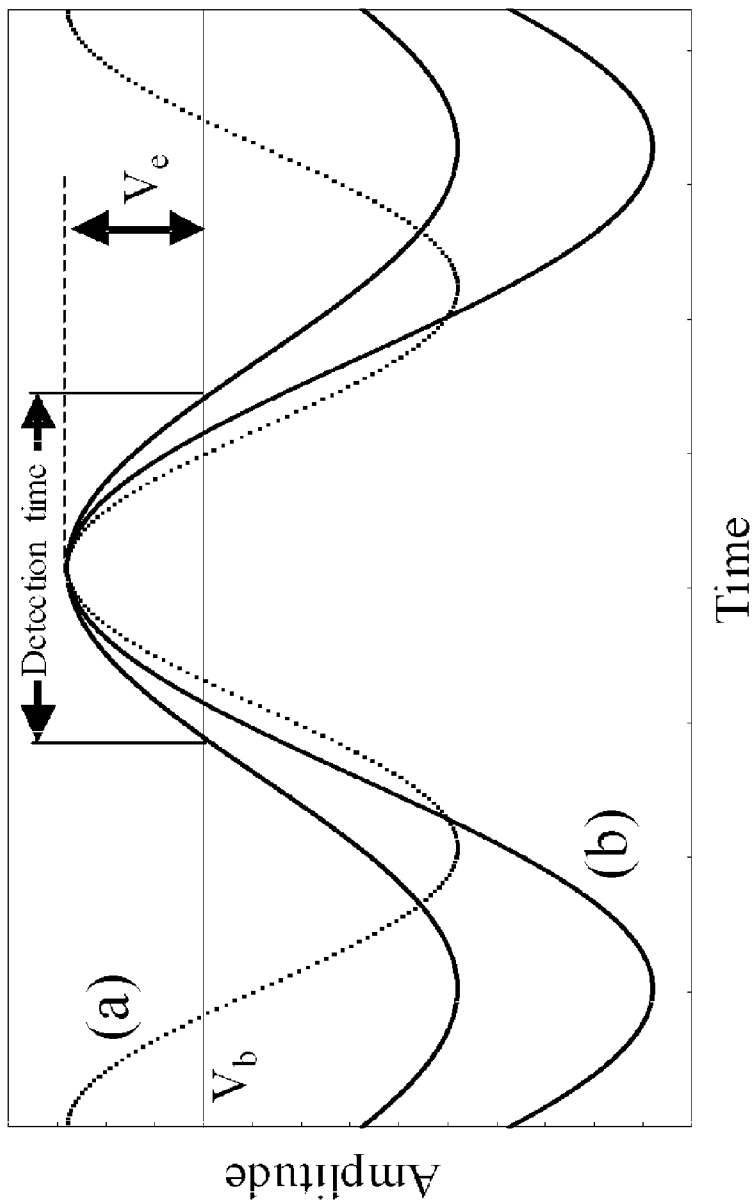
FIG. 2 shows the change in the detection time as a parameter of frequency and amplitude.
Figure 4:
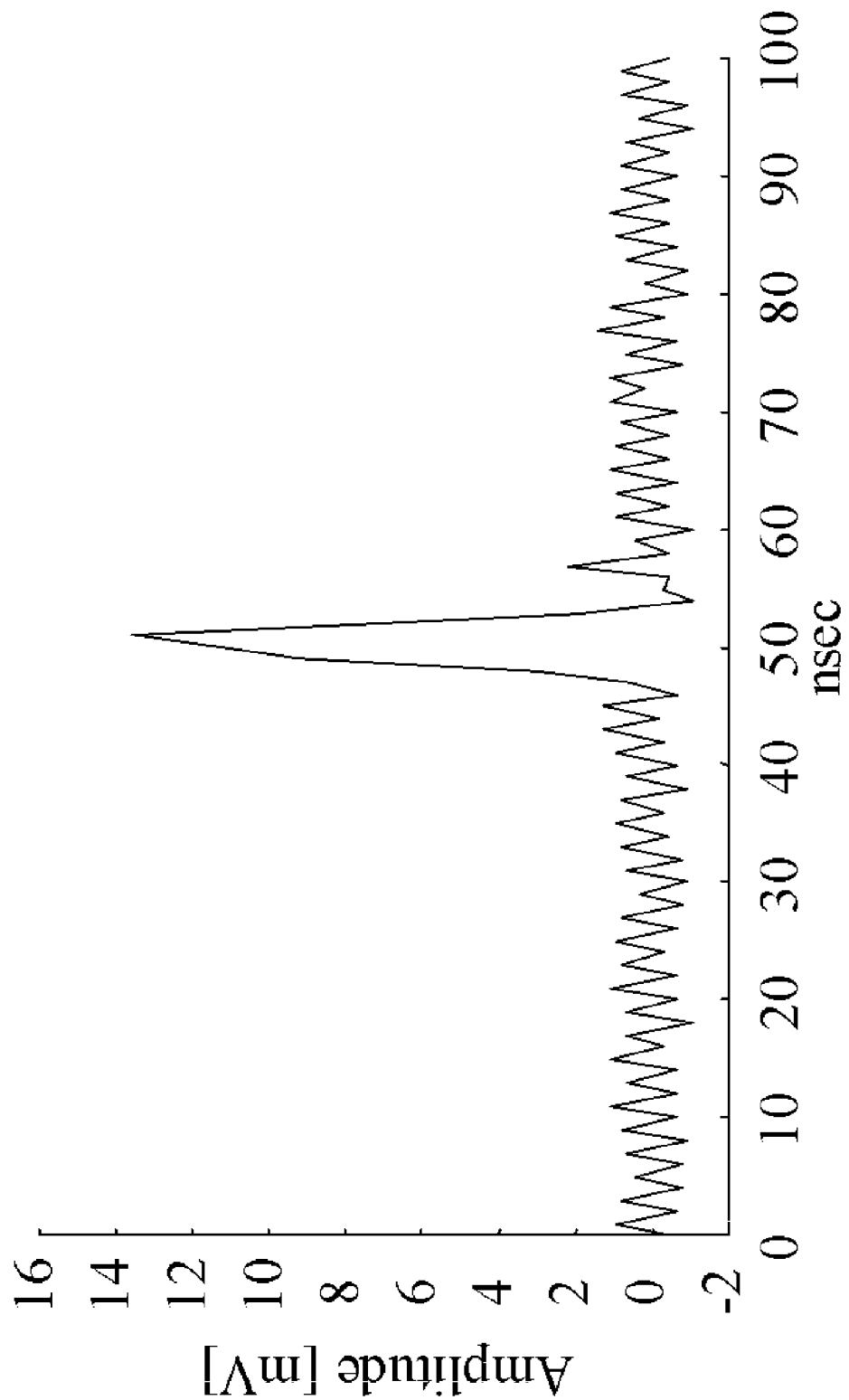
FIG. 4 shows the output signal passed through the BRF.
Figure 5:
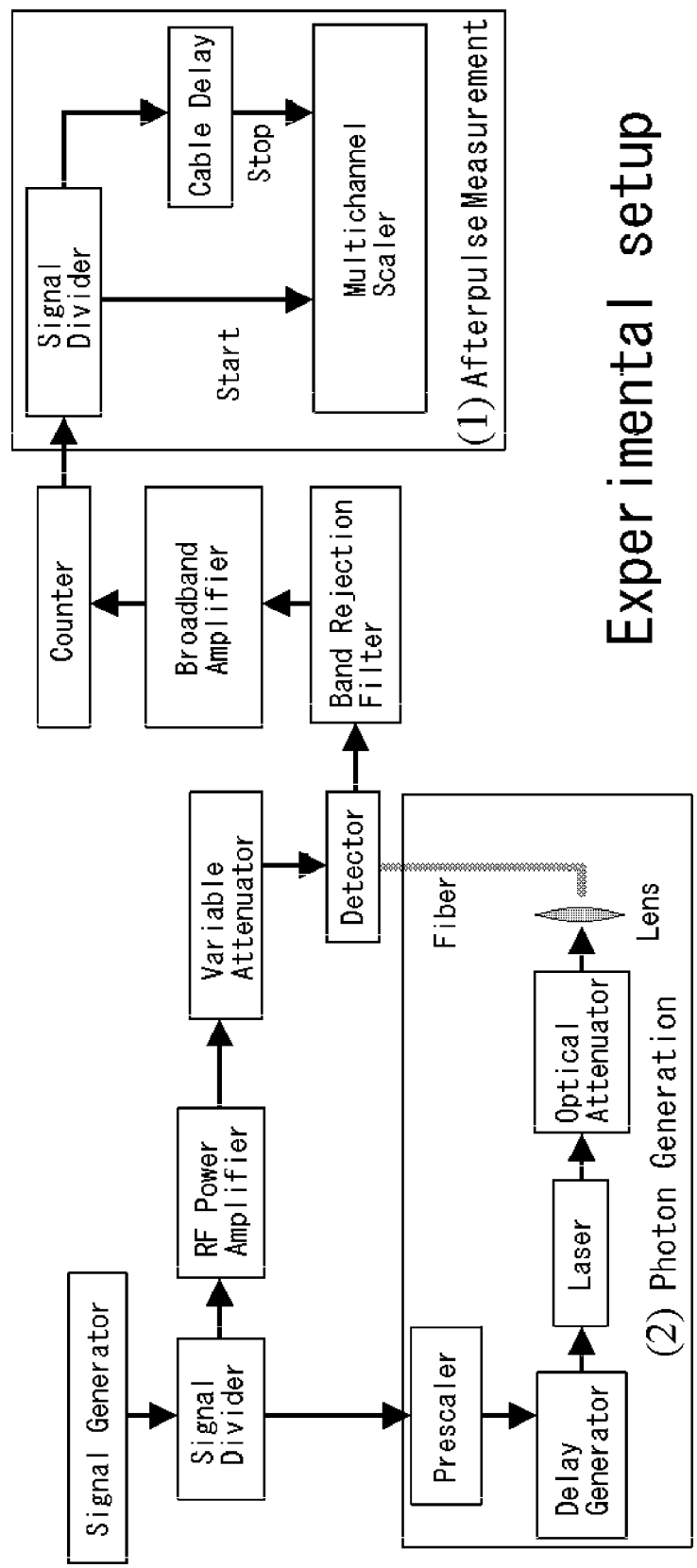
FIG. 5 is the block diagram of the entire system.
Figure 6:
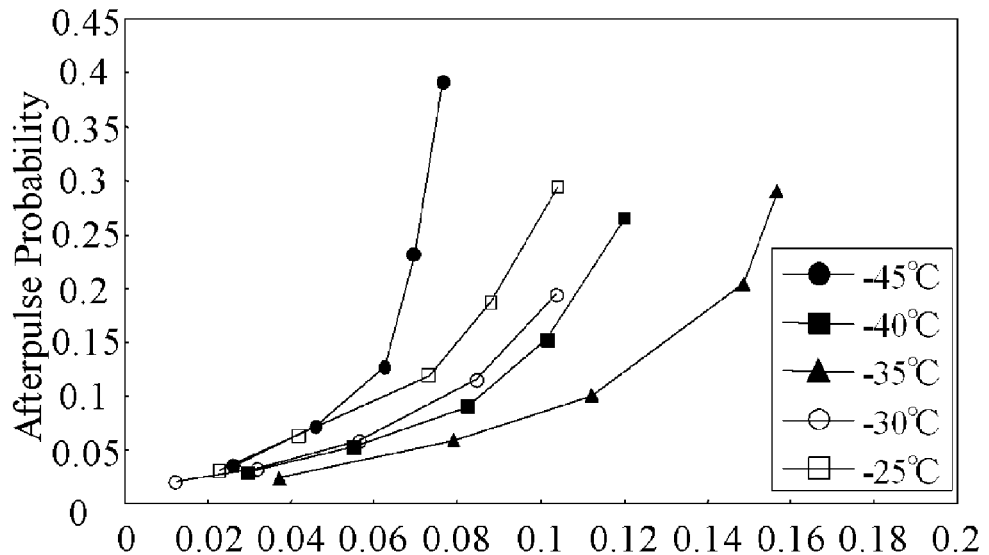
FIG. 6 shows a graph of the quantum efficiency vs. after pulsing probability at different temperatures and a graph of the quantum efficiency vs. dark count at different temperatures.
Figure 6:
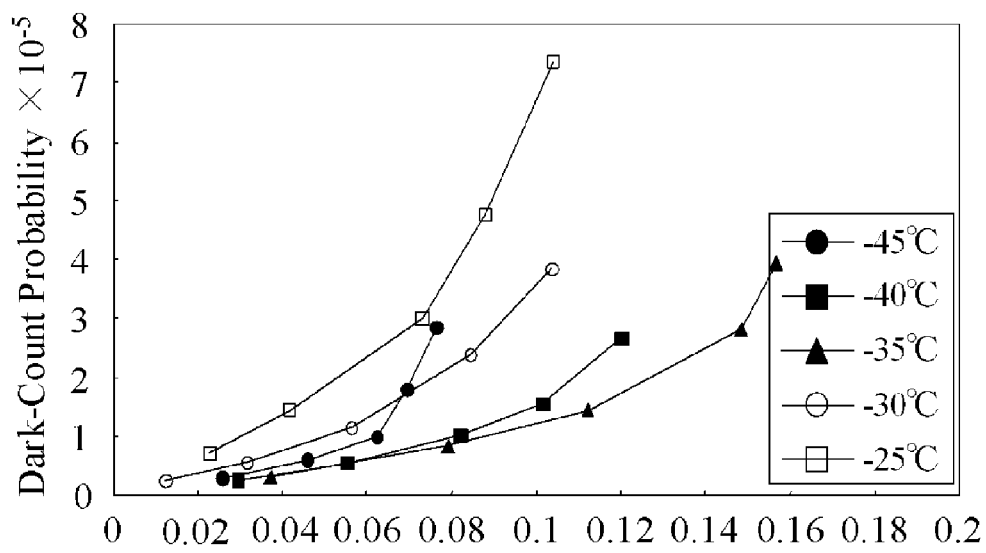
Figure 7:
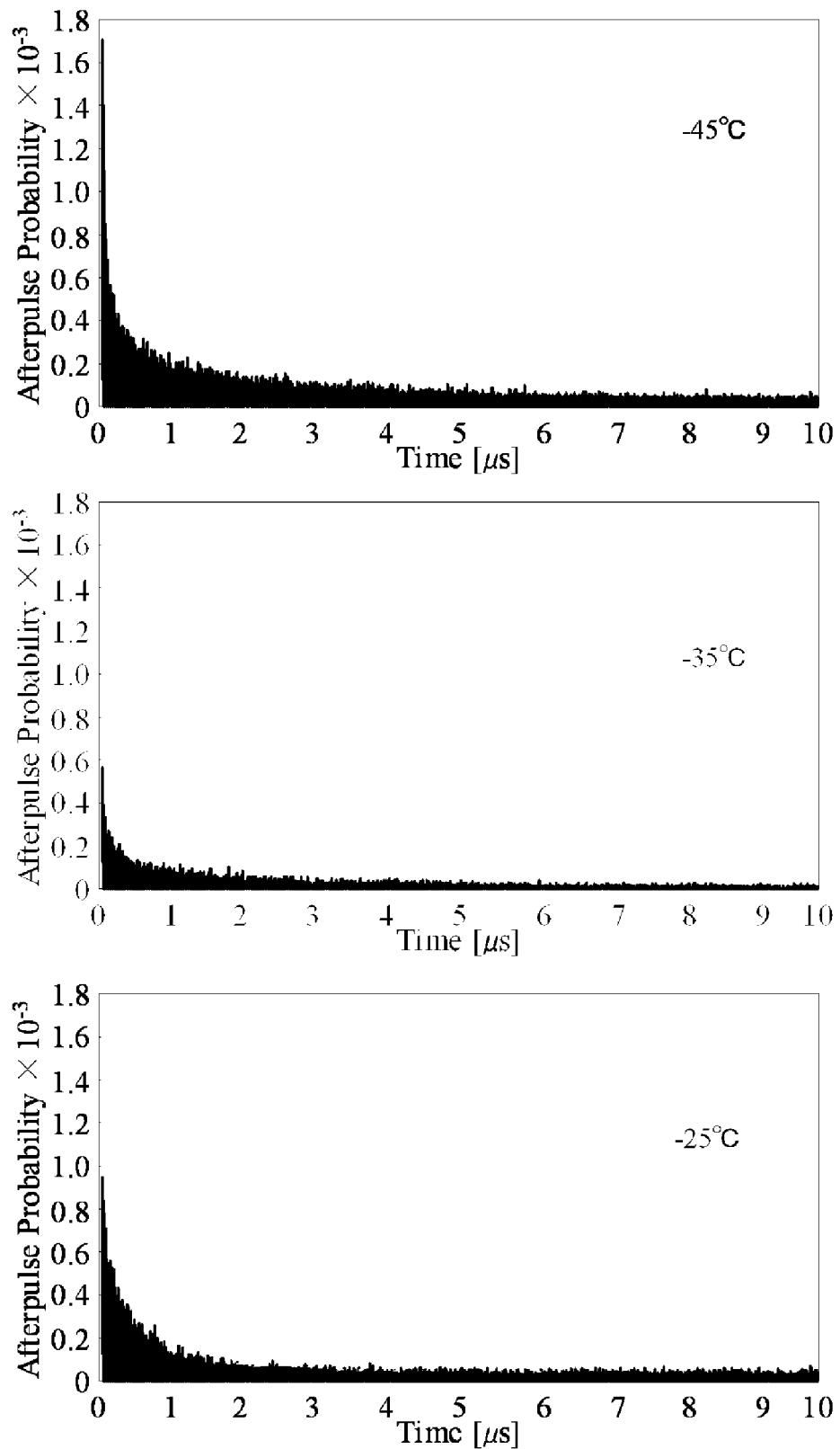
FIG. 7 is a graph to show time dependency of the after pulsing probability at different temperatures.
Figure 8:
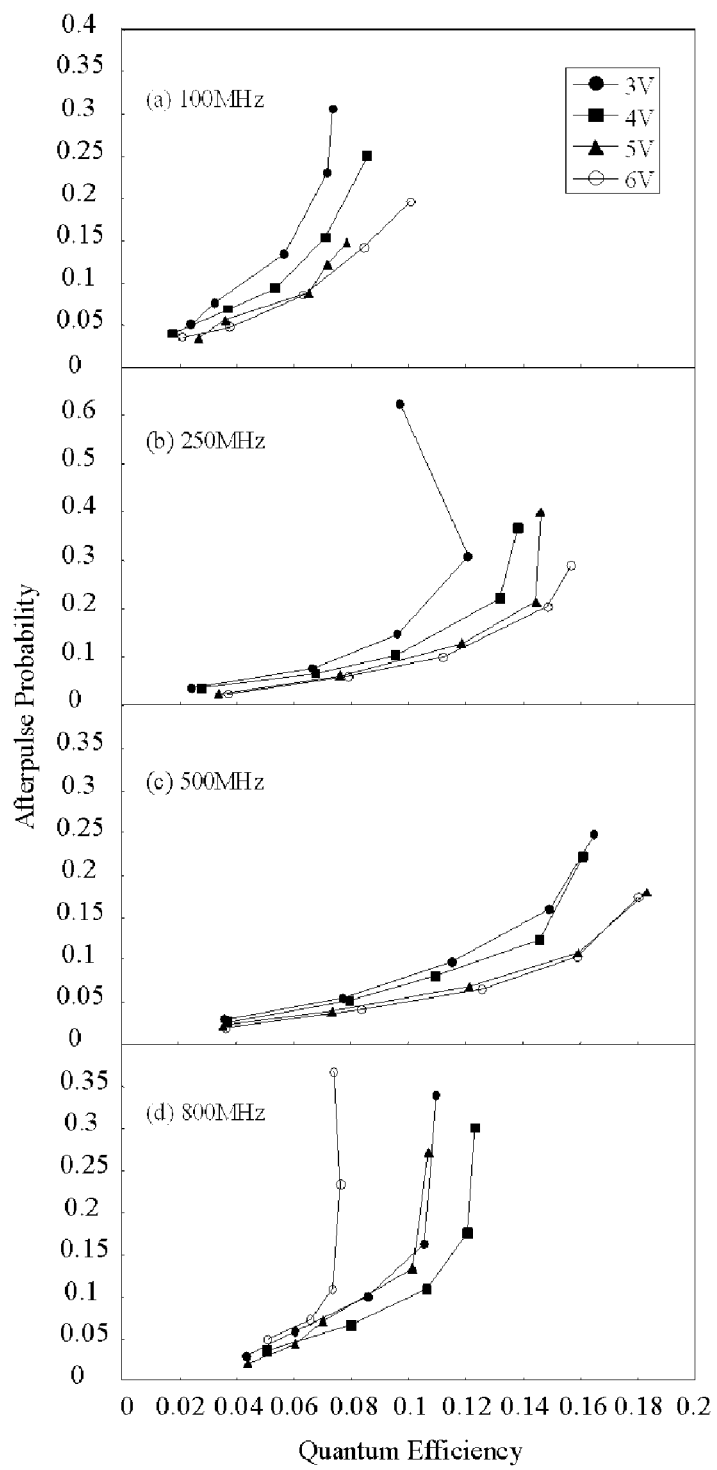
FIG. 8 is a graph of the quantum efficiency vs. after pulsing probability at different gating signal frequencies and amplitudes.
Figure 9:
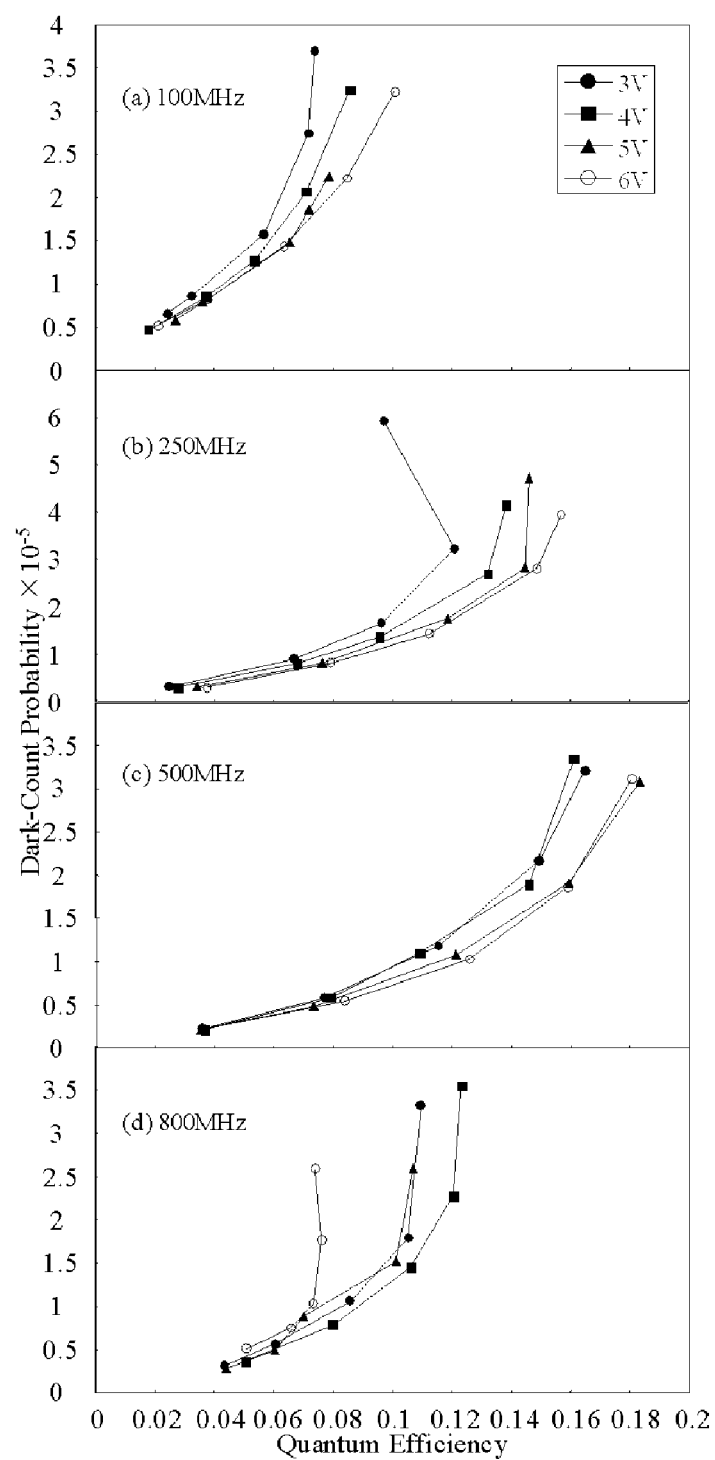
FIG. 9 is a graph of the quantum efficiency vs. dark count at different gating signal frequencies and amplitudes.
Figure 11A:
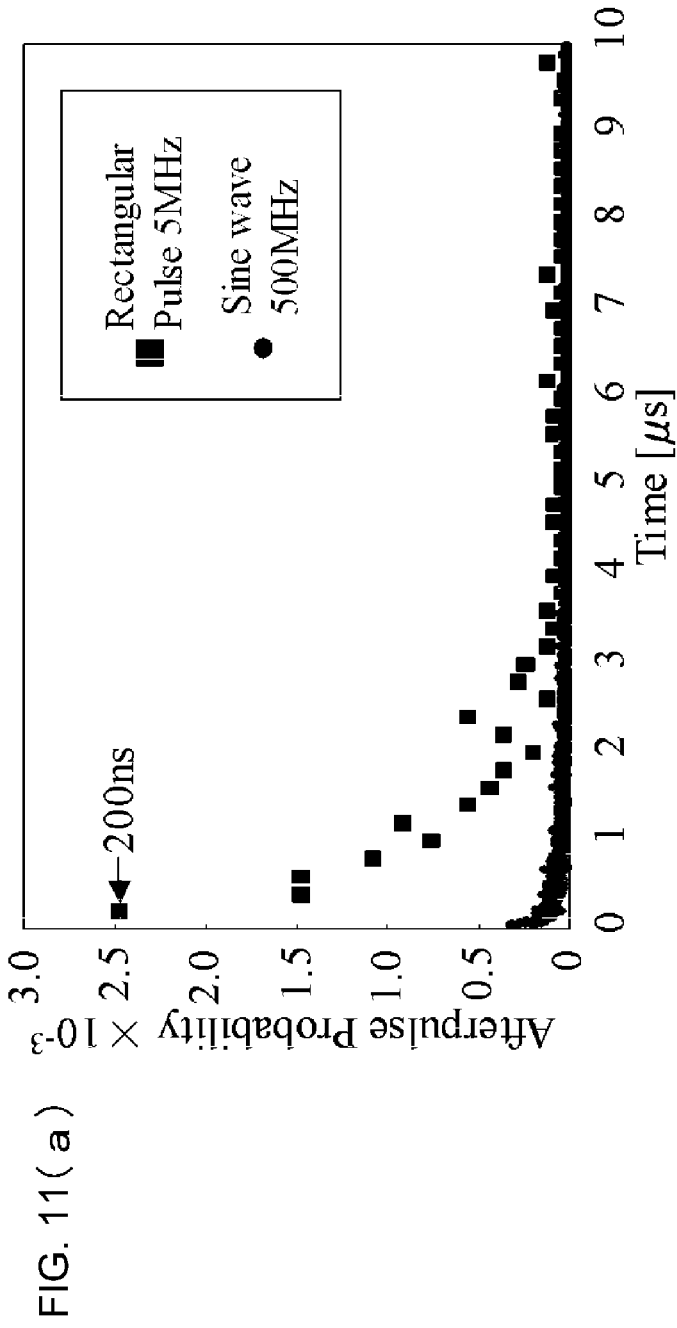
FIG. 11 is a graph showing time dependency of the after pulsing probability by different detection methods.
Figure 12A:
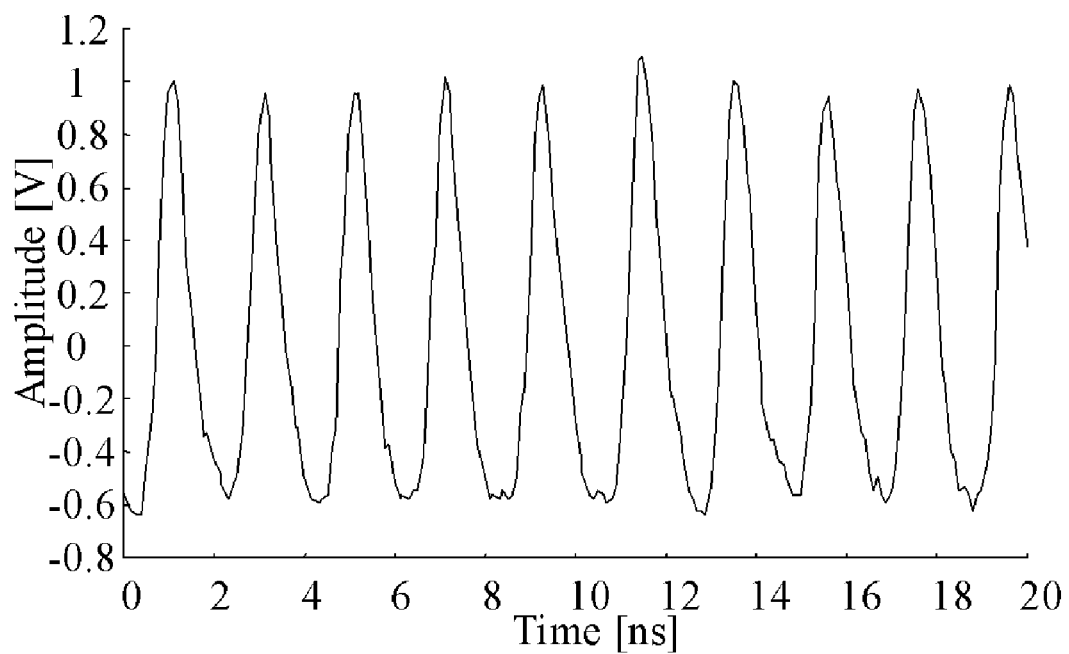
FIG. 12 is a graph of the gating signal extracted from the attenuated mode-lock signal by 16 dB.
Figure 12B:
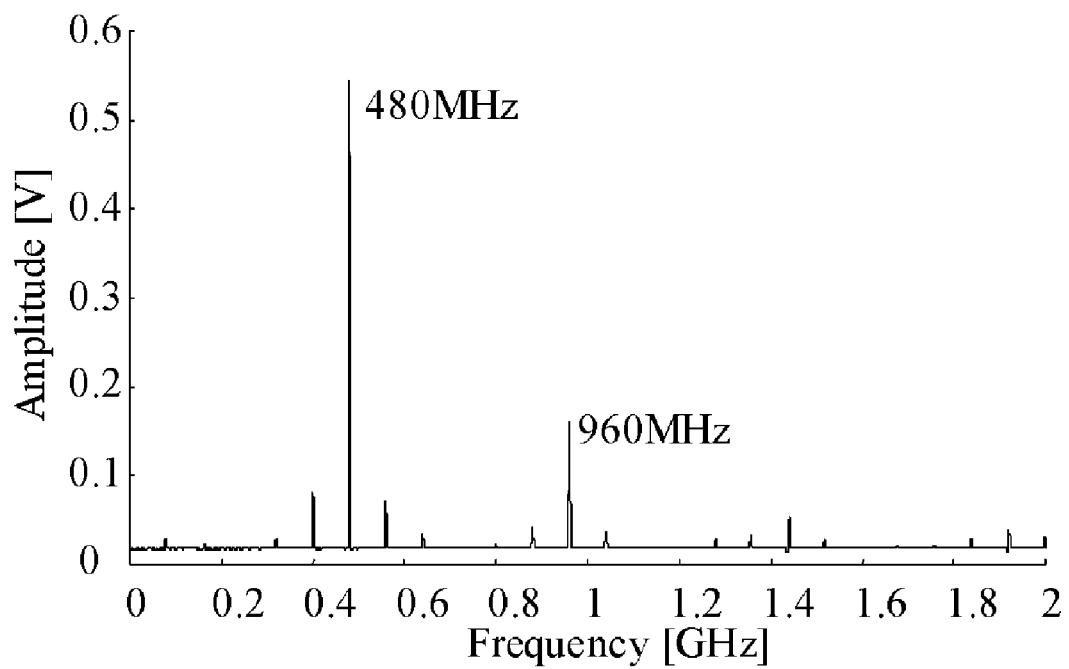
Figure 13:
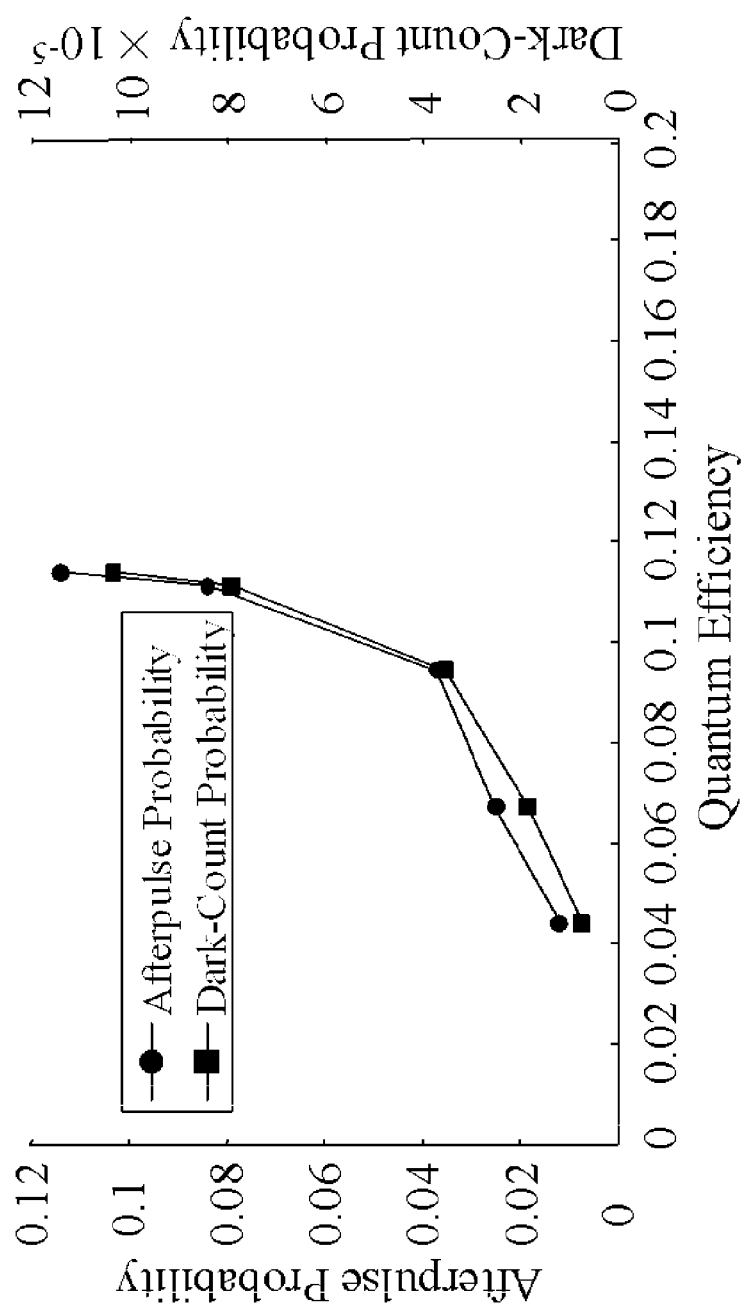
FIG. 13 is a graph of the quantum efficiency vs. after pulsing probability and dark count detected at 80 MHz.
Figure 14:
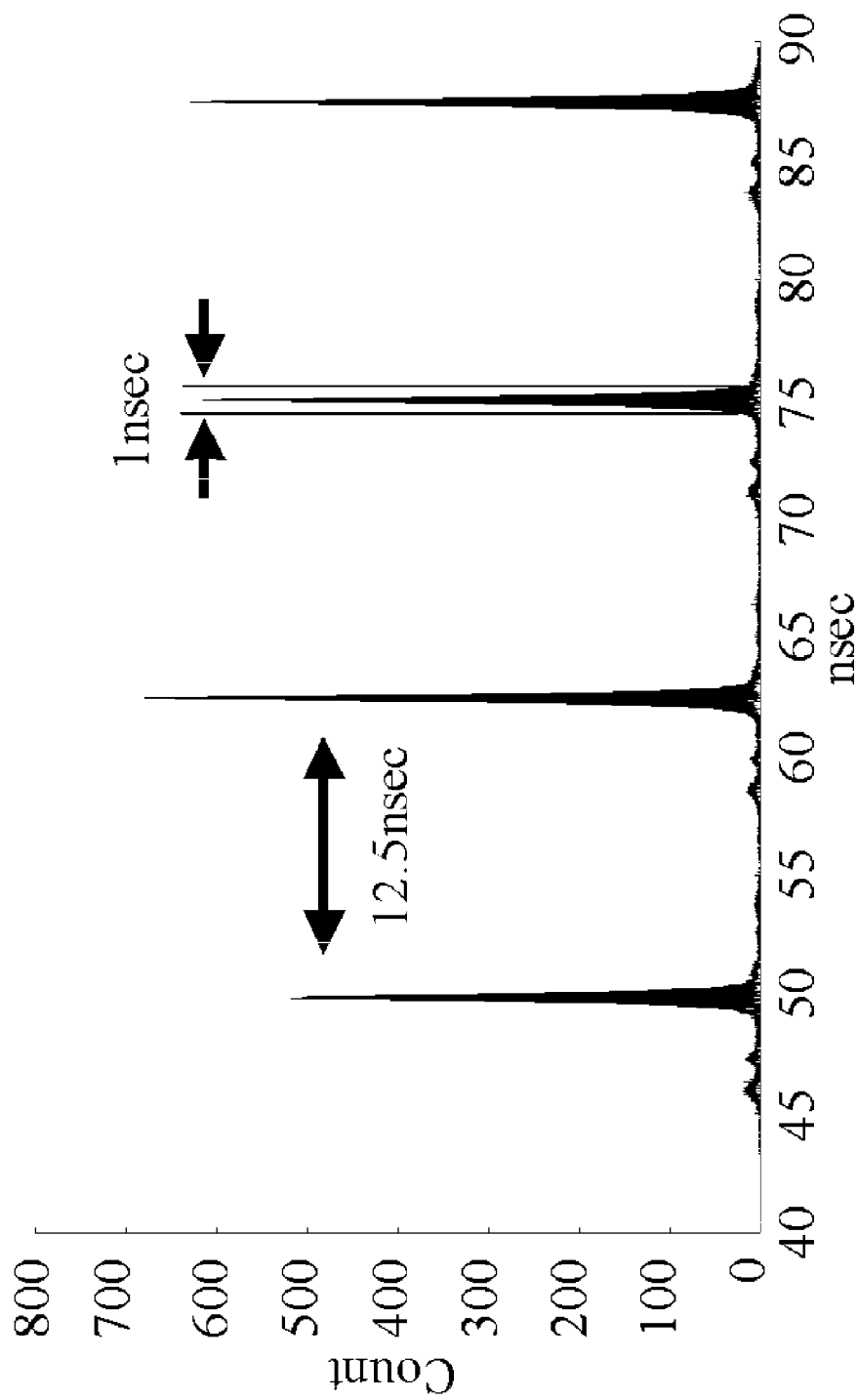
FIG. 14 is a correlation graph at photon detection.
Figure 15:
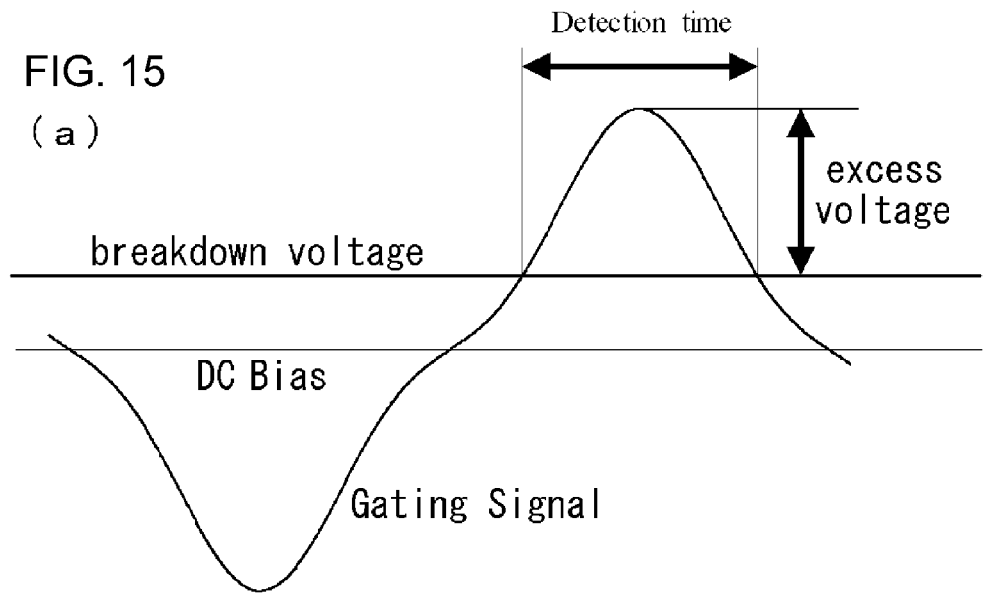
FIG. 15 is a waveform of the gating signal consisting of a fundamental wave and its harmonics.
Figure 15:
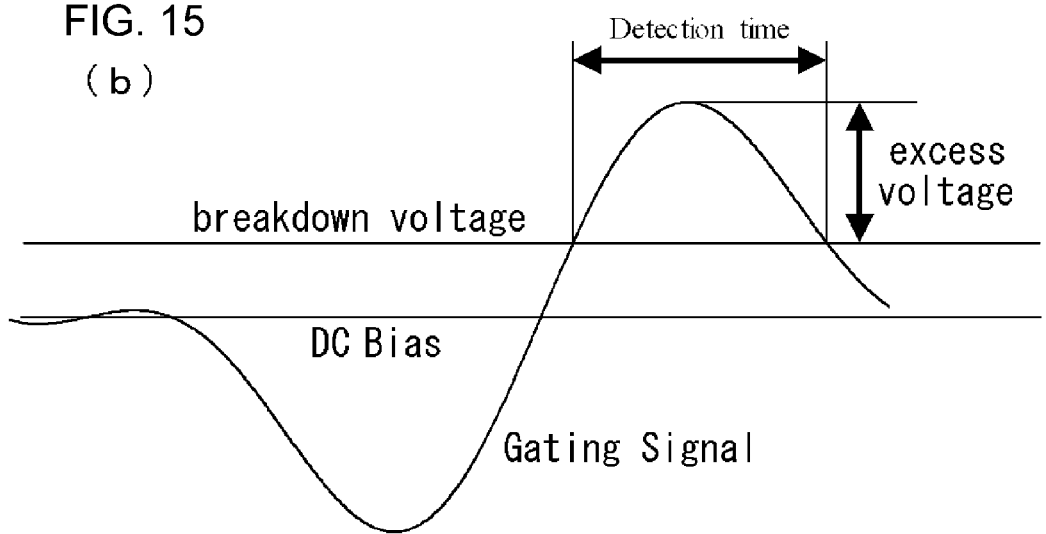
Figure 18:
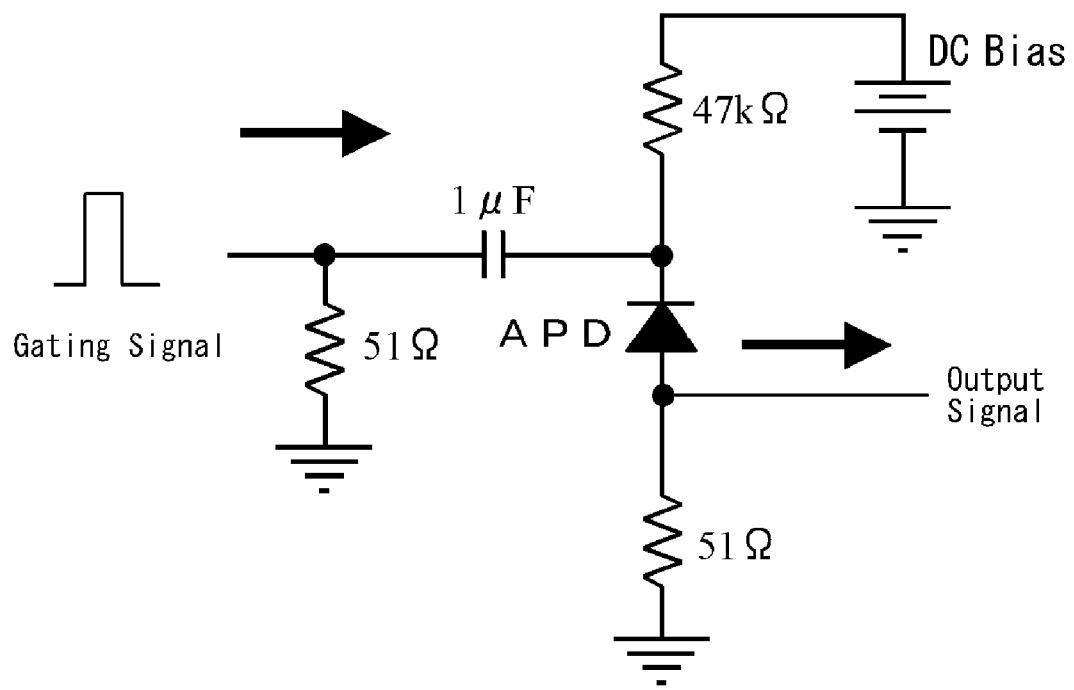
FIG. 18 is a conceptual illustration of a conventional single photon detector together with the gating signal and the detection signal.
Figure 18:
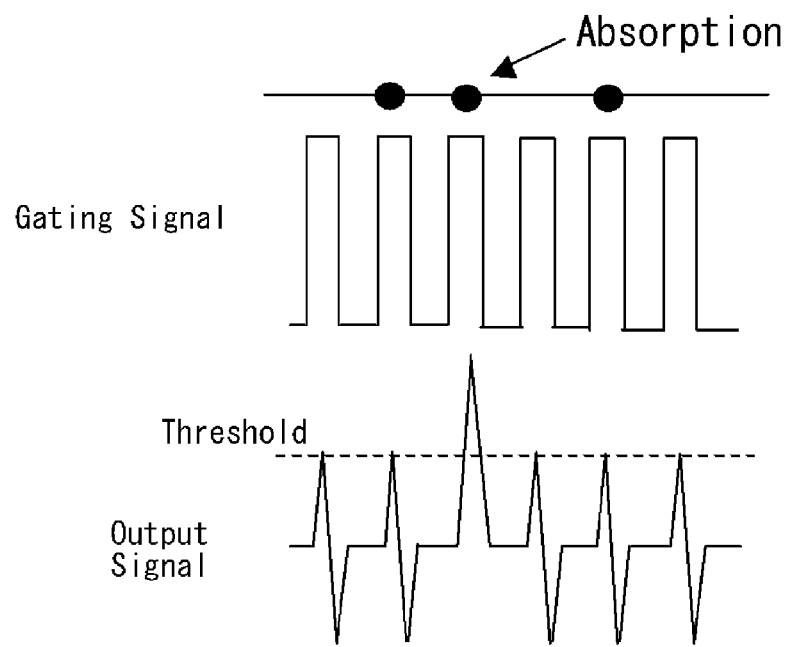

1—Avalanche Photo Diode (APD)
2—DC bias voltage
3—gating signal
4—filter
5—detection signal

The invention claimed is:

1. A single photon detector comprising:
an avalanche photodiode (APD) for detecting a single photon in communication wavelength band, bias means for applying a DC bias voltage less than the breakdown voltage of the APD to the cathode thereof, gating means for applying a sinusoidal gating signal to the APD in superimposed relationship with the DC bias voltage so as to exceed the breakdown voltage, and a filter for removing the sinusoidal gating signal components in the output signal from the APD, wherein the frequency of the sinusoidal gating signal a frequency for maximizing the S/N ratio according to the characteristics of the APD and the excess voltage of the sinusoidal gating signal is between 1 volt and 5 volts varying according to the frequency of the sinusoidal gating signal.

2. A single photon detector according to claim 1, wherein said filter is a filter to use a directional coupler.

3. A single photon detector comprising: an avalanche photodiode (APD) for detecting a single photon in communication wavelength band, bias means for applying a DC bias voltage less than the breakdown voltage of the APD to the cathode thereof, gating means for applying a gating signal consisting of a fundamental sinusoidal signal and its harmonics to the APD in superimposed relationship with the DC bias voltage so as to exceed the breakdown voltage, and plural filters for removing the gating signal components in the output signal from the APD.

4. A single photon detector according to claim 3, wherein said filter is a filter to use a directional coupler.

5. A single photon detector comprising: an avalanche photodiode (APD) for detecting a single photon in communication wavelength band, bias means for applying a DC bias voltage less than the breakdown voltage of the APD to the cathode thereof, gating means for applying a sinusoidal gating signal of integer-multiple times of the incident photon frequency to the APD in superimposed with the DC bias voltage so as to exceed the breakdown voltage, and a filter for removing the sinusoidal gating signal components in the output signal from the APD.

6. A single photon detector according to claim 5, wherein said filter is a filter to use a directional coupler.

7. A single photon detector comprising: an avalanche photodiode (APD) for detecting a single photon in communication wavelength band, bias means for applying a DC bias voltage less than the breakdown voltage of the APD to the cathode thereof, gating means for applying a gating signal consisting of a fundamental sine wave of integer-multiple times of the incident photon frequency and its harmonics to the APD in superimposed relationship with the DC bias voltage so as to exceed the breakdown voltage, and plural filters for removing the gating signal components in the output signal from the APD.

8. A single photon detector of claim 7, wherein the gating means comprises means for generating a rectangular wave from the mode-lock signal of a light source laser, a band-pass filter for selecting a desired harmonics from the rectangular wave, and means for generating a sinusoidal wave by superimposing the harmonics with the gating signal.

9. A single photon detector according to claim 8, wherein said filter is a filter to use a directional coupler.

10. A single photon detector according to claim 7, wherein said filter is a filter to use a directional coupler.

* * * * *